US010796648B2

(12) United States Patent
Sakariya et al.

(10) Patent No.: US 10,796,648 B2
(45) Date of Patent: *Oct. 6, 2020

(54) SMART PIXEL LIGHTING AND DISPLAY MICROCONTROLLER

(71) Applicant: Apple Inc., Cupertino, CA (US)

(72) Inventors: Kapil V. Sakariya, Los Altos, CA (US); Andreas Bibl, Los Altos, CA (US); Kelly McGroddy, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/512,286

(22) Filed: Jul. 15, 2019

(65) Prior Publication Data

US 2020/0005720 A1 Jan. 2, 2020

Related U.S. Application Data

(63) Continuation of application No. 15/908,499, filed on Feb. 28, 2018, now Pat. No. 10,380,952, which is a
(Continued)

(51) Int. Cl.
G09G 3/34 (2006.01)
G09G 3/3233 (2016.01)
(Continued)

(52) U.S. Cl.
CPC ......... *G09G 3/3426* (2013.01); *G09G 3/2088* (2013.01); *G09G 3/32* (2013.01); *G09G 3/3216* (2013.01); *G09G 3/3233* (2013.01); *G09G 3/3266* (2013.01); *H01L 25/0753* (2013.01); *H01L 25/167* (2013.01); *G09G 2300/0828* (2013.01); *G09G 2300/0842* (2013.01); *G09G 2300/0857* (2013.01); *G09G 2310/08* (2013.01);
(Continued)

(58) Field of Classification Search
CPC ........................... G09G 3/3426; H01L 25/167
See application file for complete search history.

(56) References Cited

U.S. PATENT DOCUMENTS 4,618,814 A 10/1986 Kato et al.
4,997,196 A 3/1991 Wood
(Continued)

FOREIGN PATENT DOCUMENTS

AU 2012-241114 A1 11/2012
CN 101025893 A 8/2007
(Continued)

OTHER PUBLICATIONS

Asano, Kazutoshi, et al., "Fundamental Study of an Electrostatic Chuck for Silicon Wafer Handling" IEEE Transactions on Industry Applications, vol. 38, No. 3, May/Jun. 2002, pp. 840-845.
(Continued)

*Primary Examiner* — Thomas L Dickey
(74) *Attorney, Agent, or Firm* — Jaffery Watson Mendonsa & Hamilton LLP

(57) ABSTRACT

A light emitting assembly is described. In one embodiment, one or more light emitting diode (LED) devices and one or more microcontrollers are bonded to a same side of a substrate, with the one or more microcontrollers to switch and drive the one or more LED devices.

18 Claims, 17 Drawing Sheets

Related U.S. Application Data continuation of application No. 15/479,962, filed on Apr. 5, 2017, now Pat. No. 9,959,815, which is a continuation of application No. 14/830,486, filed on Aug. 19, 2015, now Pat. No. 9,626,908, which is a continuation of application No. 13/717,634, filed on Dec. 17, 2012, now Pat. No. 9,153,171.

(51) Int. Cl.

| | | |
|---|---|---|
| H01L 25/075 | (2006.01) | |
| H01L 25/16 | (2006.01) | |
| G09G 3/3266 | (2016.01) | |
| G09G 3/3216 | (2016.01) | |
| G09G 3/20 | (2006.01) | |
| G09G 3/32 | (2016.01) | |

(52) U.S. Cl.
CPC .. *G09G 2320/029* (2013.01); *G09G 2330/028* (2013.01); *H01L 2924/0002* (2013.01)

(56) References Cited

U.S. PATENT DOCUMENTS

| | | | |
|---|---|---|---|
| 5,592,358 A | 1/1997 | Shamouilian et al. | |
| 5,767,822 A | 6/1998 | Hiroshi | |
| 5,839,187 A | 11/1998 | Sato et al. | |
| 5,851,664 A | 12/1998 | Bennett et al. | |
| 5,888,847 A | 3/1999 | Rostoker et al. | |
| 5,903,428 A | 5/1999 | Grimard et al. | |
| 5,996,218 A | 12/1999 | Shamouilian et al. | |
| 6,014,120 A | 1/2000 | Chiu et al. | |
| 6,071,795 A | 6/2000 | Cheung et al. | |
| 6,335,263 B1 | 1/2002 | Cheung et al. | |
| 6,403,985 B1 | 6/2002 | Fan et al. | |
| 6,420,242 B1 | 7/2002 | Cheung et al. | |
| 6,521,511 B1 | 2/2003 | Inoue et al. | |
| 6,558,109 B2 | 5/2003 | Gibbel | |
| 6,613,610 B2 | 9/2003 | Iwafuchi et al. | |
| 6,629,553 B2 | 10/2003 | Odashima et al. | |
| 6,670,038 B2 | 12/2003 | Sun et al. | |
| 6,683,587 B2 | 1/2004 | Gulson | |
| 6,786,390 B2 | 9/2004 | Yang et al. | |
| 6,788,109 B2 | 9/2004 | Kitagawa | |
| 6,878,607 B2 | 4/2005 | Inoue et al. | |
| 7,015,825 B2 | 3/2006 | Callahan | |
| 7,033,842 B2 | 4/2006 | Haji et al. | |
| 7,079,205 B2 | 7/2006 | Kuji | |
| 7,148,127 B2 | 12/2006 | Oohata et al. | |
| 7,208,337 B2 | 4/2007 | Eisert et al. | |
| 7,353,596 B2 | 4/2008 | Shida et al. | |
| 7,358,158 B2 | 4/2008 | Aihara et al. | |
| 7,502,950 B1 | 3/2009 | Brands | |
| 7,585,703 B2 | 9/2009 | Matsumura et al. | |
| 7,622,367 B1 | 11/2009 | Nuzzo et al. | |
| 7,723,764 B2 | 5/2010 | Oohata et al. | |
| 7,795,629 B2 | 9/2010 | Watanabe et al. | |
| 7,797,820 B2 | 9/2010 | Shida et al. | |
| 7,838,410 B2 | 11/2010 | Hirao et al. | |
| 7,880,184 B2 | 2/2011 | Iwafuchi et al. | |
| 7,884,543 B2 | 2/2011 | Doi | |
| 7,888,690 B2 | 2/2011 | Iwafuchi et al. | |
| 7,906,787 B2 | 3/2011 | Kang | |
| 7,910,945 B2 | 3/2011 | Donofrio et al. | |
| 7,927,976 B2 | 4/2011 | Menard | |
| 7,928,465 B2 | 4/2011 | Lee et al. | |
| 7,972,875 B2 | 7/2011 | Rogers et al. | |
| 7,982,296 B2 | 7/2011 | Nuzzo et al. | |
| 7,988,332 B2 | 8/2011 | Lo | |
| 7,999,454 B2 | 8/2011 | Winters et al. | |
| 8,023,248 B2 | 9/2011 | Yonekura et al. | |
| 8,328,405 B2 | 12/2012 | Negley | |
| 8,344,629 B2 | 1/2013 | Deixier | |
| 8,344,639 B1 | 1/2013 | Bahrehmand | |
| 8,378,781 B1 | 2/2013 | Peterson | |
| 8,395,312 B2 | 3/2013 | Hum | |
| 8,440,546 B2 | 5/2013 | Nuzzo et al. | |
| 8,476,844 B2 | 7/2013 | Hancock et al. | |
| 8,506,867 B2 | 8/2013 | Menard | |
| 8,664,699 B2 | 3/2014 | Nuzzo et al. | |
| 8,680,889 B2 | 3/2014 | Leshniak | |
| 8,789,971 B2 | 7/2014 | Lo et al. | |
| 8,865,489 B2 | 10/2014 | Rogers et al. | |
| 8,877,648 B2 | 11/2014 | Bower et al. | |
| 8,889,485 B2 | 11/2014 | Bower | |
| 8,896,218 B2 | 11/2014 | Bora et al. | |
| 8,934,259 B2 | 1/2015 | Bower et al. | |
| 9,113,526 B2 | 8/2015 | Stewart | |
| 9,153,171 B2 | 10/2015 | Sakariya et al. | |
| 9,218,759 B2 | 12/2015 | Wong et al. | |
| 9,391,118 B2 | 7/2016 | Negley et al. | |
| 9,480,108 B2 | 10/2016 | Pi | |
| 9,626,908 B2 | 4/2017 | Sakariya et al. | |
| 9,959,815 B2 | 5/2018 | Sakariya et al. | |
| 10,380,952 B2 | 8/2019 | Sakariya et al. | |
| 2001/0029088 A1 | 10/2001 | Odajima et al. | |
| 2002/0064032 A1 | 5/2002 | Oohata | |
| 2002/0076848 A1 | 6/2002 | Spooner et al. | |
| 2003/0117344 A1 | 6/2003 | Hine | |
| 2003/0177633 A1 | 9/2003 | Haji et al. | |
| 2003/0197664 A1 | 10/2003 | Koyama | |
| 2004/0032637 A1 | 2/2004 | Imamura | |
| 2005/0017268 A1 | 1/2005 | Tsukamoto et al. | |
| 2005/0185113 A1 | 8/2005 | Weindorf et al. | |
| 2006/0256049 A1 | 11/2006 | Schou | |
| 2007/0019129 A1 | 1/2007 | Negley | |
| 2007/0166851 A1 | 7/2007 | Tran et al. | |
| 2008/0163481 A1 | 7/2008 | Shida et al. | |
| 2009/0068774 A1 | 3/2009 | Slater et al. | |
| 2009/0146917 A1 | 6/2009 | Kharrati et al. | |
| 2009/0167644 A1 | 7/2009 | White et al. | |
| 2009/0314991 A1 | 12/2009 | Cho et al. | |
| 2010/0141646 A1 | 6/2010 | Tanabe | |
| 2010/0177127 A1 | 7/2010 | Akiyama et al. | |
| 2010/0188391 A1 | 7/2010 | Kim | |
| 2010/0188794 A1 | 7/2010 | Park et al. | |
| 2010/0219758 A1 | 9/2010 | Melzner et al. | |
| 2010/0244695 A1 | 9/2010 | Van Herpen et al. | |
| 2010/0244734 A1 | 9/2010 | Van Herpen et al. | |
| 2010/0248484 A1 | 9/2010 | Bower et al. | |
| 2010/0309100 A1 | 12/2010 | Cok et al. | |
| 2011/0003410 A1 | 1/2011 | Tsay et al. | |
| 2011/0069096 A1 | 3/2011 | Li et al. | |
| 2011/0141004 A1 | 6/2011 | Kwon et al. | |
| 2012/0009691 A1 | 1/2012 | Chung | |
| 2012/0018494 A1 | 1/2012 | Jang et al. | |
| 2012/0064642 A1 | 3/2012 | Huang et al. | |
| 2012/0068600 A1 | 3/2012 | Hartmann et al. | |
| 2012/0134065 A1 | 5/2012 | Furuya et al. | |
| 2012/0218318 A1 | 8/2012 | Hirao et al. | |
| 2012/0250323 A1 | 10/2012 | Velu | |
| 2012/0256814 A1 | 10/2012 | Ootorii | |
| 2012/0326634 A1 | 12/2012 | Li | |
| 2013/0154490 A1* | 6/2013 | Harbers | H05B 45/20 315/193 |
| 2014/0132154 A1 | 5/2014 | Fried | |
| 2014/0168037 A1 | 6/2014 | Sakariya et al. | |
| 2014/0175988 A1 | 6/2014 | Plourde et al. | |
| 2014/0373898 A1 | 12/2014 | Rogers et al. | |
| 2015/0356918 A1 | 12/2015 | Sakariya et al. | |
| 2017/0206845 A1 | 7/2017 | Sakariya et al. | |
| 2018/0190211 A1 | 7/2018 | Sakariya et al. | |

FOREIGN PATENT DOCUMENTS

| | | |
|---|---|---|
| CN | 101329837 A | 12/2008 |
| CN | 101730333 A | 6/2010 |
| CN | 102239745 A | 11/2011 |
| CN | 102338342 A | 2/2012 |
| CN | 102346095 A | 2/2012 |
| CN | 102356424 A | 2/2012 |
| CN | 102395829 A | 3/2012 |
| EP | 1 694 099 A2 | 8/2006 |
| JP | 3406207 | 5/1999 |

(56) References Cited

FOREIGN PATENT DOCUMENTS

| JP | 2005-003696 | | 1/2005 |
|---|---|---|---|
| JP | 2005-003696 | A | 1/2005 |
| JP | 2006-190851 | | 7/2006 |
| JP | 2007-335731 | | 12/2007 |
| JP | 2010161264 | A | 7/2010 |
| JP | 2011-507032 | | 3/2011 |
| JP | 2011-507032 | A | 3/2011 |
| KR | 1019960015353 | A | 6/2000 |
| KR | 10-2008-0049515 | | 6/2008 |
| KR | 1020090119862 | A | 11/2009 |
| KR | 10-2011-0030780 | | 3/2011 |
| KR | 10-2012-0067250 | | 6/2012 |
| KR | 1020130013508 | A | 2/2013 |
| TW | 200822697 | A | 5/2008 |
| WO | WO 03/023745 | A1 | 3/2003 |
| WO | WO 2008/007535 | | 1/2008 |
| WO | 2008029548 | A1 | 3/2008 |
| WO | WO 2011/123285 | | 10/2011 |
| WO | WO 2012/044262 | A1 | 4/2012 |
| WO | WO 2012/108890 | A1 | 8/2012 |
| WO | 2014099499 | A1 | 6/2014 |

OTHER PUBLICATIONS

Bower, C.A., et al., "Active-Matrix OLED Display Backplanes Using Transfer-Printed Microscale Integrated Circuits", IEEE, 2010 Electronic Components and Technology Conference, pp. 1339-1343.

"Characteristics of electrostatic Chuck(ESC)" Advanced Materials Research Group, New Technology Research Laborotory, 2000, pp. 51-53 accessed at http://www.socnb.com/report/ptech_e/2000p51_e.pdf.

Guerre, Roland, et al, "Selective Transfer Technology for Microdevice Distribution" Journal of Microelectromechanical Systems, vol. 17, No. 1, Feb. 2008, pp. 157-165.

Han, Min-Koo, "AM backplane for AMOLED" Proc. of ASID '06, Oct. 8-12, New Delhi, pp. 53-58.

Harris, Jonathan H., "Sintered Aluminum Nitride Ceramics for High-Power Electronic Applications" Journal of the Minerals, Metals and Materials Society, vol. 50, No. 6, Jun. 1998, p. 56.

Horwitz, Chris M., "Electrostatic Chucks: Frequently Asked Questions" Electrogrip, 2006, 10 pgs, accessed at www.electrogrip.com.

Hossick-Schott, Joachim, "Prospects for the ultimate energy density of oxide-based capacitor anodes" Medtronic Energy and Components Center, 10 pgs.

Lee, San Youl, et al., "Wafer-level fabrication of GAN-based vertical light-emitting diodes using a multi-functional bonding material system" Semicond. Sci. Technol. 24, 2009, 4 pgs.

"Major Research Thrust: Epitaxial Layer Transfer by Laser Lift-off" Purdue University, Heterogeneous Integration Research Group, accessed at https://engineering.purdue.edu/HetInt/project_epitaxial_layer_transfer_llo.htm, last updated Aug. 2003.

Mei, Zequn, et al., "Low Temperature Solders" Hewlett-Packard Journal, Article 10, Aug. 1996, pp. 1-10.

Mercado, Lei, L., et al., "A Mechanical Approach to Overcome RF MEMS Switch Stiction Problem" 2003 Electronic Components and Technology Conference, pp. 377-384.

Miskys, Claudio R., et al., "Freestanding GaN-substrates and devices" phys. Stat. sol. © 0, No. 6, 2003, pp. 1627-1650.

"Principles of Electrostatic Chucks: 1—Techniques for High Perfomance Grip and Release" ElectroGrip, Principles1 rev3 May 2006, 2 pgs, accessed at www.electrogrip.com.

Steigerwald, Daniel, et al., "III-V Nitride Semiconductors for High-Perfromance Blue and Green Light-Emitting Devices" article appears in journal JOM 49 (9) 1997, pp. 18-23. Article accessed Nov. 2, 2011 at http://www.tms.org/pubs/journals/jom/9709/setigerwald-9709.html, 12 pgs.

Widas, Robert, "Electrostatic Substrate Clamping for Next Generation Semiconductor Devices" Apr. 21, 1999, 4 pgs.

"12-Bit High Bandwidth Multiplying DAC with Serial Interface: Data Sheet AD5452W," Rev. 0, Analog Devices, Inc., 2012, 24 pgs.

"Circuit Note CN-0139: Single Supply Low Noise LED Current Source Driver Using a Current Output DAC in the Reverse Mode" Rev. 0, Analog Devices, Inc., 2009, 2 pgs.

"LM3450: LM3450A LED Drivers with Active Power Factor Correction and Phase Dimming Decoder," Texas Instruments, Inc. SNVS681C, Nov. 2010—Revised Jun. 2011, 37 pgs.

"Application Guide: Driving LEDs," found at www.micropowerdirect.com, Jun. 21, 2011, 8 pgs.

Tsujimura, et al., "OLED Displays: Fundamentals and Applications" 4.3 Passive-Matrix OLED Display, pp. 91-109, 5.2 TFT Process, pp. 110-120, 7.2 OLED Lighting Requirement, pp. 191-196, 2012, John Wiley & Sons, Inc., Hoboken, New Jersey, USA.

PCT International Search Report and Written Opinion for International Application No. PCT/US2013/074156, dated Mar. 31, 2014, 17 pages.

Bower, et al., "Transfer-Printed Integrated Circuits for Display Backplanes," Semprius, Inc., ISSN-L 1883-2490/17/1203, 2010, pp. 1203-1206.

Bullis, Kevin, "Making Nanoelectronics for Displays," MIT Technology Review, Dec. 19, 2006, 3 pgs. Web. Jan. 14, 2014. <http://m.technologyreview.com/NanoTech/17912/>.

"Semprius Named to MIT Technology Review's 2013 50 Disruptive Companies List Recognizing World's Most Innovative Companies," Business Wire, Feb. 20, 2013, 3 pgs. Web. Jan. 13, 2014. <http://www.businesswire.com/news/home/20130220005266/en/Semprius-Named-Mit-Technology-Review's-2013-50>.

Wagner, et al., "The Semprius CPV Module Optics Performance," 3rd Workshop on Concentrating Photovoltaic Optics and Power, 2010, 26 pgs.

PCT International Preliminary Report on Patentability for PCT/US2013/074156 dated Jul. 2, 2015, 13 pages.

Microchip Tehnology Inc., DS41203D, PIC16F688 Microontroller Data Sheet, Dec. 2007, pp. 1-7.

\* cited by examiner

SMART PIXEL LIGHTING AND DISPLAY MICROCONTROLLER

RELATED APPLICATIONS

This application is a continuation of co-pending U.S. patent application Ser. No. 15/908,499, filed Feb. 28, 2018, which is a continuation of U.S. patent application Ser. No. 15/479,962, filed Apr. 5, 2017, now U.S. Pat. No. 9,959,815, which is a continuation of U.S. patent application Ser. No. 14/830,486, filed Aug. 19, 2015, now U.S. Pat. No. 9,626,908, which is a continuation of U.S. patent application Ser. No. 13/717,634, filed on Dec. 17, 2012, now U.S. Pat. No. 9,153,171, which is incorporated herein by reference.

BACKGROUND

Field

The present invention relates to a light emitting diode (LED) microcontroller. More particularly, embodiments of the present invention relate to an LED microcontroller for use in display or lighting applications.

Background Information

Flat panel displays utilizing LED devices are gaining popularity in a wide range of electronic devices, from small, handheld electronic devices to large outdoor displays. High-resolution LED displays, such as those used in modern computer displays, smart phones and televisions, typically use an active matrix display structure. In an active matrix display, active driving circuitry is attached to each pixel or sub-pixel, allowing precise voltage switching for the individual pixels that passive matrix displays lack. The precise voltage switching allows for improved image quality and response time in comparison to passive matrix displays. In conventional active matrix displays, the switching circuitry at each pixel is implemented using a thin-film transistor (TFT) backplane driving the emissive elements. A typical TFT switching circuit used in emissive active matrix displays is the 2T1C circuit, which contains two transistors and one capacitor, although more advanced TFT circuits is possible.

The use of the TFT backplane allows improved precision in relation to passive matrix displays, however the use of the thin-film transistor backplane is not without drawbacks. High quality TFT fabrication is costly. The highest quality TFTs require fabrication on a quartz substrate due to the high temperatures involved in the fabrication process. Lower temperature processes can be used with a glass substrate, however the resulting transistors may suffer from low carrier mobility, reducing the conductivity of the transistors. Current leakage and power consumption can also become a problem, and uniformity issues can arise at various points during the fabrication process.

SUMMARY OF THE DISCLOSURE

A smart-pixel microcontroller for controlling light emitting diodes is described. The smart-pixel microcontroller can be used to replace the TFT backplane used in LED and LCD display technology, and can add new functionality not previously possible using thin film transistors as switching and driving element in a display. In an embodiment a light emitting assembly includes one or more light emitting diode (LED) devices and one ore more microcontroller to switch and drive the one or more LED devices. The one ore more LED devices and the one or more microcontrollers are bonded to the same side of a substrate. In an embodiment, an LED device and microcontroller are bonded to the substrate with a material such as indium, gold, silver, copper, or alloys thereof.

In one embodiment, the smart-pixel integrated circuit is configured for analog input, and has an input block and an output block containing electronics. In such embodiment, the smart-pixel microcontroller is controlled with a voltage applied to scan lines and a data lines, similar to an active matrix display. In analog form, the smart-pixel microcontroller can accept at least one analog data input to control at least one LED device, although multiple LED devices can be controlled with a single microcontroller. In one embodiment, the smart-pixel microcontroller supplements analog circuitry with digital storage to facilitate adaptive refresh rates and display self refresh. In one embodiment, capacitive storage is used to storage analog input.

In one embodiment, the smart-pixel microcontroller is configured for digital input, and has an input block and output block containing digital logic, and a storage module with embedded memory. Digital input can come by way of a digital bus or point-to-point data link. Multiple LED devices or sensor devices can be controlled with a single microcontroller. In one embodiment, adaptive display updates are facilitated by data storage in each integrated circuit.

In one embodiment, a plurality of LED devices are bonded to the same side of the substrate as the microcontroller, and are in electrical connection with the microcontroller. The LED devices can be used as sub-pixels in a display, and can be configured in a red, green, blue (RGB) sub-pixel arrangement. Other sub-pixel arrangements and schemes are also possible. In an embodiment, the light emitting assembly includes an array of LED devices and an array of microcontrollers bonded to the same side of the substrate. The number of microcontrollers in the array of microcontrollers is less than the number of LED devices in the array of LED devices. In an embodiment, each microcontroller is in electrical connection with a plurality of pixels to drive a plurality of LED devices in each pixel.

In addition to the controlling the emissive elements of the display, the microcontroller can couple with one or more optical, electrical or thermal sensors. Alternatively the microcontroller may include one or more sensors. In one embodiment, the smart-pixel microcontroller couples with one or more pressure sensors, which can be used to give visual display feedback on a display when the display is touched, or to transmit user input in a touch display. In one embodiment, sensors can be used to detect a drift in the white point of the display over time, and the display can be re-calibrated from time to time to maintain a consistent white point.

One embodiment of a method of manufacturing a display or lighting device using a receiving substrate, one or more transfer heads, and one or more carrier substrates is also disclosed. The lighting or display device can be manufactured by placing a micro scale sub-pixel array on a receiving substrate, where the receiving substrate is prepared with distribution lines to couple the components of the micro scale sub-pixel array. In an embodiment, a method of manufacturing a light emitting assembly includes positioning an array of transfer heads over a substrate carrying a plurality of LED devices, picking up the plurality of LED devices, and placing the plurality of LED devices on a receiving substrate. This process may be repeated for a separate substrate carrying other plurality of LED devices, for example, with different light emission characteristics. The same or different array of transfer heads may be used. The same or different array of transfer heads are then positioned over a substrate carrying a plurality of microcontrollers, pick up the plurality of microcontrollers, and place the microcontrollers on the same side of the receiving substrate as the plurality of LED devices. In accordance with embodiments of the invention the arrays of transfer heads may operate in accordance with electrostatic principles. The plurality of LED devices and microcontrollers may also be bonded to the receiving substrate. In an embodiment, bonding is achieved by heating the plurality of LED devices and plurality of microcontrollers with the respective array of transfer heads. Bonding may also be achieved by thermocompression bonding with the array of transfer heads. Additionally one or more sensor devices can also be placed on the receiving substrate using an electrostatic transfer head.

The above summary does not include an exhaustive list of all aspects to be discussed. It is contemplated that what is detailed below includes all systems and methods that can be practiced from all suitable combinations of the various aspects summarized above.

BRIEF DESCRIPTION OF THE DRAWINGS

Embodiments are illustrated by way of example and not limitation in the figures of the accompanying drawings, in which.

DETAILED DESCRIPTION

Figure 1:
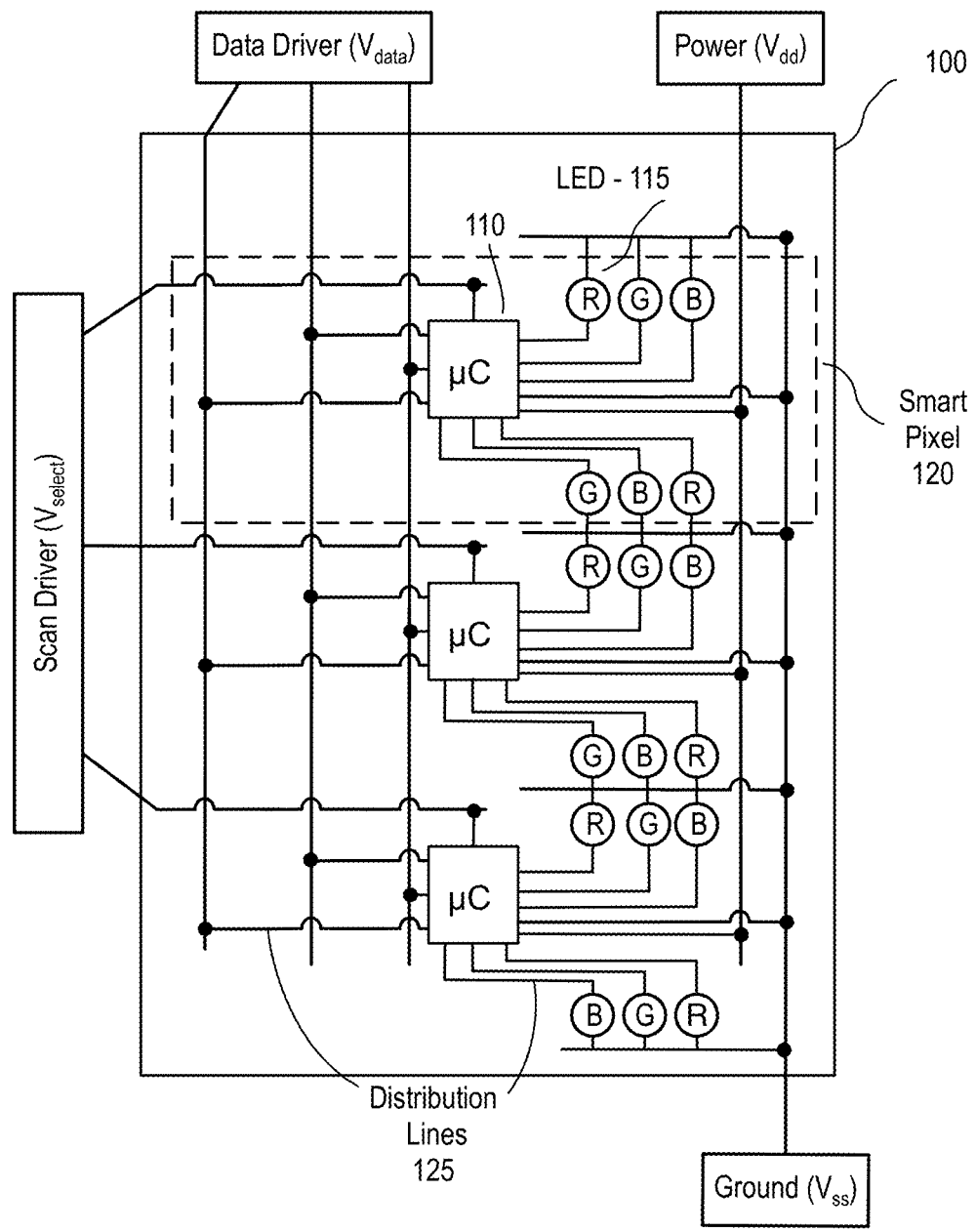
FIG. 1 is a circuit diagram of a smart-pixel micro-matrix in accordance with one embodiment.

Embodiments of the present invention provide a "smart-pixel" microcontroller for light emitting devices. The smart-pixel microcontroller utilizes the performance, efficiency, and reliability of wafer-based microcontroller devices to replace the thin film electronics used to form TFT backplanes. In one embodiment, one or more light-emitting devices are coupled with the smart-pixel microcontroller to create a smart-pixel light-emitting device. The emissive element of the smart-pixel light-emitting device can be one or more light emitting diodes (LED) devices, one or more organic LED (OLED) devices, or one or more micro-LED ($\mu$LED) devices. The absence of the TFT fabrication process allows the smart-pixel "micro-matrix" to be manufactured using a range of substrates, including rigid, semi-rigid, or flexible substrates, glass substrates, plastic substrates, or any application suitable substrate, as the substrate does not have to undergo a TFT fabrication process.

The smart-pixel device can be created by transferring one or more LED devices, and one or more smart-pixel microcontrollers onto a receiving substrate, which has been prepared with distribution lines to couple each smart-pixel microcontroller to its respective LED devices, other smart pixel controllers, and/or external devices and circuits. The smart-pixel device can also include one or more sensors in addition to, or in place of one or more LED devices. The micro controller ($\mu$C), LED devices, and sensor devices are bonded to the same side of the substrate surface. Bonds can be made using various connections such as, but not limited to, pins, conductive pads, conductive bumps, and conductive balls. Metals, metal alloys, solders, conductive polymers, or conductive oxides can be used as the conductive materials forming the pins, pads, bumps, or balls. In an embodiment, conductive contacts on the $\mu$C, LED devices, or optional sensor devices are thermocompression bonded to conductive pads on the substrate. In this manner, the bonds may function as electrical connections to the $\mu$C, LED devices, or sensor devices. In an embodiment, bonding includes alloy bonding the conductive contacts with the conductive pads. For example, the conductive contacts or conductive pads may include a material such as indium, gold, silver, tin, or copper for bonding. In an embodiment, when bonded together, the conductive contacts and conductive pads form an alloy such as indium-gold, tin-gold, tin-silver-copper. Other exemplary bonding methods that may be utilized with embodiments of the invention include, but are not limited to, thermal bonding and thermosonic bonding. In an embodiment, the $\mu$C, LED devices, or sensor devices are bonded to landing pads in electrical connection with the distribution lines on the substrate to electrically couple one or more LED devices to the smart-pixel $\mu$C. The receiving substrate can vary based on the application of the smart-pixel micro-matrix. In one embodiment, a display substrate is used, to form a smart-pixel micro-matrix LED display device, in which the smart-pixels are used as picture elements in a high-resolution display.

In one embodiment, the smart-pixel micro-matrix is constructed on a receiving substrate suitable for use in lighting devices. The smart-pixel microcontrollers can be used to maintain precise brightness, uniformity, and color control over the emitted light. In one embodiment, the smart-pixel micro-matrix is used as an LED backlight, for liquid crystal display (LCD) devices. Blue or UV LEDs in combination with a yellow, blue-yellow or white phosphor can be used to provide a white backlight for LCD displays. White light can also be generated by various combinations of single color LED devices with or without the use of phosphors. In addition to white lighting, additional single color LED devices (e.g., red, amber, green, blue, etc.) devices can also be used to provide a wider color gamut and color rendering index than otherwise possible with white backlights.

One or more smart-pixel microcontrollers may also couple to form a microcontroller network. A hierarchy of microcontrollers can be used, where a tiered arrangement exists between microcontrollers. Multiple types of microcontrollers can be used for various applications, and the microcontrollers can each be tied to a common data bus, coupled in a daisy chain, or may communicate wirelessly. The microcontroller network can enable fault tolerance, and can be used to determine the state of the smart-pixel micro-matrix.

In one embodiment, two-way communication is enabled between the smart-pixel microcontrollers and other devices in the smart-pixel micro-matrix. One or more sensors can couple with the smart-pixel microcontroller along with the emissive elements. The sensors can be ambient light sensors, optical sensors, electrical sensors, or thermal sensors. In one embodiment, a pressure sensor is used, for example to give visual display feedback on a display when the display is touched, or to transmit user input in a touch display. In a smart-pixel micro-matrix display, sensors can be used to detect a drift in the white point of the display over time, and the display can be re-calibrated from time to time to maintain a consistent white point.

In one embodiment, a smart-pixel element is a micro scale device created by the coupling of a micro scale sub-pixel controller (μC) device with a micro LED (μLED) device. The term "micro" in "micro scale, "micro LED device," "μLED device," "μC device" and "micro scale pixel controller" all refer to the scale of 1 to 100 μm. For example, each μLED or each μC device may have a maximum (x, y) dimension of 1 to 100 μm. However, it is to be appreciated that the embodiments described herein may be applicable to larger, and possibly smaller size scales, based on the application. In one embodiment micro scale sensor devices are used, along with pLED devices. Exemplary μLED devices and microchips that may be utilized as micro-scale microcontroller devices in accordance with some embodiments are described in U.S. patent application Ser. No. 13/711,554. Though embodiments are not limited to such, and the μLED devices and microchips described in U.S. patent application Ser. No. 13/711,554 are meant to be exemplary and not limiting. Such micro LED devices are highly efficient at light emission and may consume very little power (e.g., 250 mW for a 10 inch display) compared to 5-10 watts for LCD or OLED emission. In one embodiment, a smart-pixel is created using an OLED as the emissive component. In one embodiment, an inorganic LED is used as the emissive component of the smart-pixel. It should be appreciated, however, the smart-pixel micro scale microcontroller can also couple with standard LEDs, and applications are not limited specifically to micro scale LEDs. In some embodiments the size of the μLED devices and a μC within a smart-pixel is determined by the size of the pixel pitch and resolution of a display. Exemplary display dimensions are described in Table 1 below.

Various methods and configurations of the smart-pixel device are described, including display, lighting, and backlighting configurations in various size scales. However, certain embodiments may be practiced without one or more of the specific details disclosed, or in combination with other known methods and configurations. In order to provide a thorough understanding, numerous specific details are set forth, such as specific configurations, dimensions and processes. In some instances, well-known techniques and components have not been described in particular detail, to avoid unnecessarily obscuring the discussion.

Throughout this specification, a reference to "one embodiment," "an embodiment" or the like, indicates that a particular feature, structure, configuration, or characteristic described in connection with the embodiment is included in at least one embodiment of the invention. Thus, the appearances of the phrase "in one embodiment," "in an embodiment" or the like in various places throughout this specification are not necessarily referring to the same embodiment of the invention. Furthermore, the particular features, structures, configurations, or characteristics may be combined in any suitable manner in one or more embodiments.

The terms "over," "to," "between," and "on" as used herein may refer to a relative position of one layer with respect to other layers. One layer "over," or "on" another layer or bonded "to" another layer may be directly in contact with the other layer or may have one or more intervening layers. One layer "between" layers may be directly in contact with the layers or may have one or more intervening layers.

The term "ON" as used in this specification in connection with a device state refers to an activated state of the device, and the term "OFF" refers to a de-activated state of the device. The term "ON" as used herein in connection with a signal received by a device refers to a signal that activates the device, and the term "OFF" used in this connection refers to a signal that de-activates the device. A device may be activated by a high voltage or a low voltage, depending on the underlying electronics implementing the device. For example, a PMOS transistor device is activated by a low voltage while a NMOS transistor device is activated by a high voltage. Thus, it should be understood that an "ON" voltage for a PMOS transistor device and a NMOS transistor device correspond to opposite (low vs. high) voltage levels. It is also to be understood that where $V_{dd}$ and $V_{ss}$ is illustrated or described, it can also indicate one or more $V_{dd}$ and/or $V_{ss}$. For example, a digital $V_{dd}$ for can be used for data input, digital logic, memory devices, etc, while another $V_{dd}$ is used for driving the LED output block.

FIG. 1 is a circuit diagram of a smart-pixel micro matrix in accordance with one embodiment. In one embodiment, the smart-pixel micro-matrix 100 replaces the emissive element and the TFT layer of a conventional active matrix display with a micro-scale smart-pixel microcontroller (μC) integrated circuit device 110, to switch and drive one or more LED devices 115. In one embodiment, the smart-pixel micro matrix 100 is manufactured on a receiving substrate, which has been prepared with distribution lines 125 to couple the various μC devices 110 and the LED devices 115. In one embodiment, the distribution lines include scan lines, which are coupled to one or more scan drivers $V_{select}$, and data lines, which are coupled to one or more data drivers $V_{data}$. As illustrated, the LED devices 115 are coupled with a common ground, but may each have a separate ground. In this figure, and in the figures to follow, each illustrated LED device 115 may represent a single LED device, or may represent multiple LED devices arranged in series, in parallel, or a combination of the two, such that that multiple LED devices may be driven from the same control signal. While the exemplary circuit in FIG. 1 illustrates three control inputs and six LED outputs, embodiments are not so limited. A single μC 110 can control multiple pixels on a display, or multiple LED device 115 groupings for a lighting device. In one embodiment, a single μC 110 can control fifty to one hundred pixels.

In one embodiment, the μC device 110 couples with one or more red, green, and blue LED devices 115 that emit different colors of light. In a red-green-blue (RGB) sub-pixel arrangement, each pixel includes three sub-pixels that emit red, green and blue lights, respectively. The RGB arrangement is exemplary and that embodiments are not so limited. Additional sub-pixel arrangements include, red-green-blue-yellow (RGBY), red-green-blue-yellow-cyan (RGBYC), or red-green-blue-white (RGBW), or other sub-pixel matrix schemes where the pixels may have a different number of sub-pixels, such as the displays manufactured under the trademark name PenTile®.

In one embodiment, the smart-pixel micro-matrix is used in LED lighting solutions, or as an LED backlight for an LCD device. When used as a light source, blue or UV LEDs in combination with a yellow or blue-yellow phosphor may be used to provide a white backlight for LCD displays. In one embodiment, a smart-pixel micro-matrix using one or more blue LED devices, such as an indium gallium nitride (InGaN) LED device, is combined with the yellow luminescence from cerium doped yttrium aluminum garnet (YAG:$Ce^{3+}$) phosphor. In one embodiment, red, green, and blue phosphors are combined with a near-ultraviolet/ultraviolet (nUV/UV) InGaN LED device to produce white light. The phosphor can be bonded to the surface of the LED device, or a remote phosphor can be used. In addition to white light emission, additional red, green and/or blue LED device can also be used to provide a wider color gamut than otherwise possible with white backlights.

Figure 2:
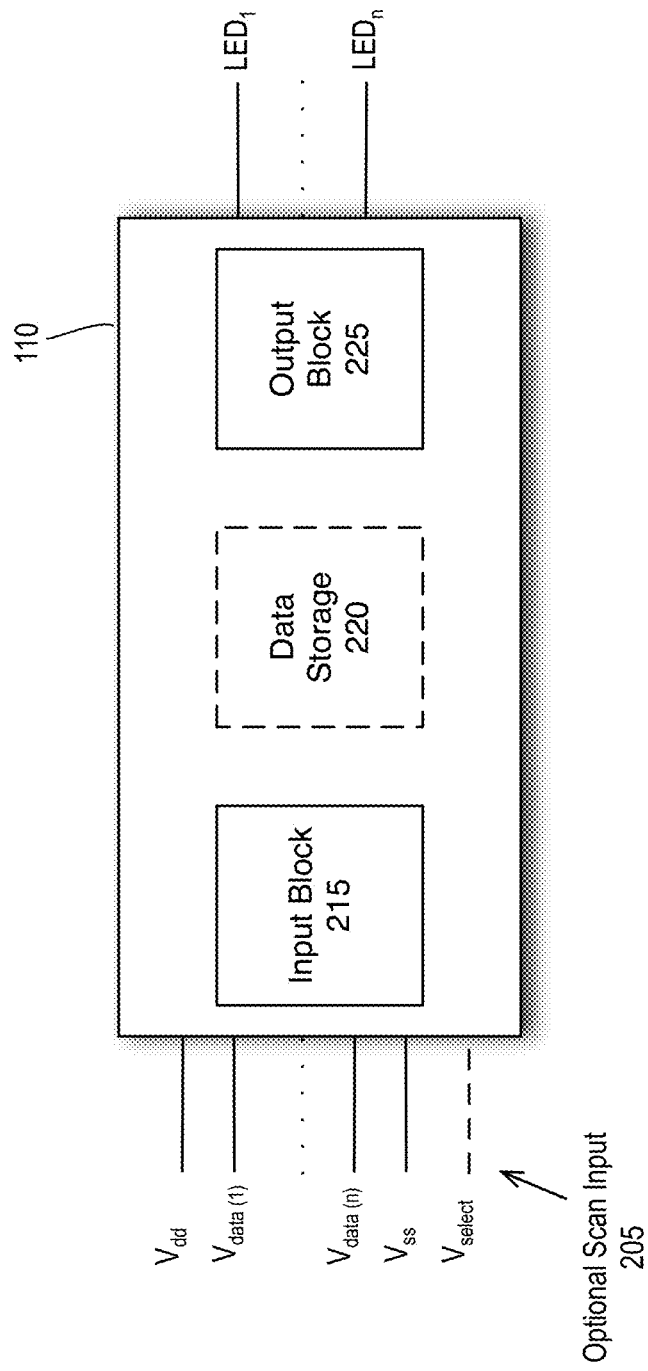
FIG. 2 is a block diagram of a smart-pixel microcontroller structure, according to one embodiment.

FIG. 2 is a block diagram of a smart-pixel μC structure, according to one embodiment. In one embodiment, the smart-pixel μC device 110 has an input block 215 and an output block 225. In one embodiment, the smart-pixel μC device 110 has an additional data storage module 210, which can be an analog data storage module with one or more capacitors, or can be a digital data storage module consisting of static random access memory (SRAM), dynamic random access memory (DRAM), or nonvolatile memory, such as flash memory. The input block 210 couples with input pins for power $V_{dd}$ and ground $V_{ss}$, as well as one or more input pins $V_{data(1)}$ through $V_{data(n)}$. The smart-pixel μC 110 is configurable to accept at least one input, which can control at least one LED device, or at least one group of LED devices in series, parallel, or a combination of the two, such as one or more LED devices which may be used in a white light source. In one embodiment, three input control signals control up to three LED devices (e.g., $LED_1$, $LED_2$, and $LED_3$) with red, green, and blue output, to create an RGB sub-pixel arrangement. In one embodiment, more than three LED devices can be controlled, to allow sub-pixel arrangements such as red-green-blue-yellow (RGBY), red-green-blue-yellow-cyan (RGBYC), or red-green-blue-white (RGBW), or other sub-pixel schemes where the pixels may have a different number of sub-pixels. In one embodiment, the smart-pixel μC 110 has a $V_{select}$ input pin coupled with a scan driver input, to provide a row select signal. In one embodiment, explicit row select input is omitted in favor of using a data update signal on the data input.

In one embodiment, the output block 225 is configured to output current to the various emissive devices coupled to the μC 110. In configurations using traditional analog driving techniques, the input voltage signal from the input data lines are converted to the appropriate current to drive each of the coupled sub-pixels. For example, a voltage input to $V_{data(1)}$ can drive the $LED_1$ output in an LED lighting device. If the μC 110 input module has multiple inputs, such as $V_{data(1)}$ through $V_{data(n)}$, the output block 225 can output up to n control lines from $LED_1$ through $LED_n$. One or more LEDs in series, parallel or a combination, can couple to the one or more LED outputs.

In one embodiment, the smart-pixel μC 110 has a data storage module 220, to store data values when input is received. The data storage module 220, which may be an analog or digital storage module, stores the data associated with each display update. In one embodiment, the data storage module 220 contains one or more capacitors to store an incoming analog voltage from an analog input block. In one embodiment, the data storage module 220 contains at least one cell of random access memory (RAM), such as static RAM (SRAM) or dynamic RAM (DRAM), to store a digital value. In one embodiment, the data storage module 220 contains flash memory. When the data storage module 220 is enabled, the smart-pixel μC 110 stores the incoming data for each pixel and can continuously display data with minimal or no requirement for regular refreshing of static data. Instead, the pixel can continue to display the stored data until the display controller indicates an update event. Additionally, multiple frames of pixel data can be transmitted to the smart-pixel μC 110 in a burst manner and stored in the storage module 220. The smart-pixel μC 110 can then cycle through the multiple frames at a specific update rate, or based upon an update signal from the display controller.

Figure 3:
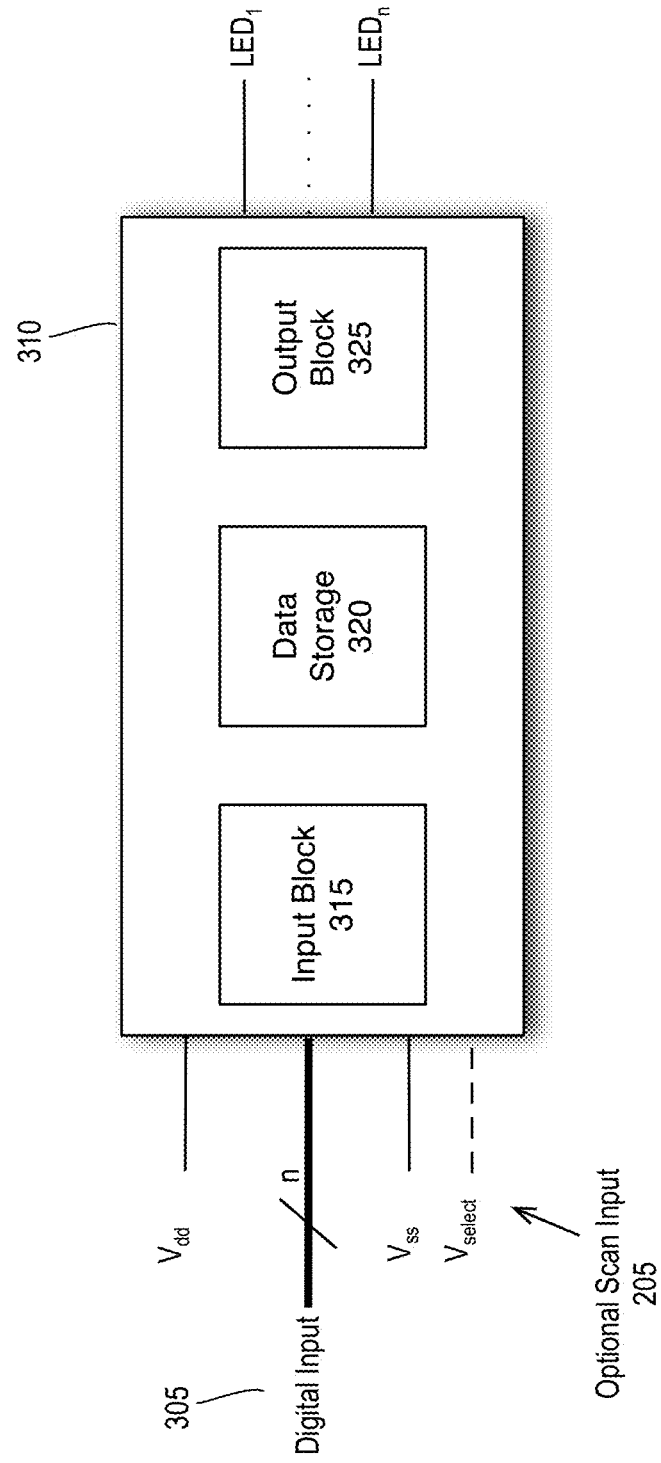
FIG. 3 is a block diagram of an alternate smart-pixel microcontroller structure, according to one embodiment.

FIG. 3 is a block diagram of an alternate smart-pixel μC, according to one embodiment. In one embodiment, the smart-pixel μC 310 has an input block 315, data storage module 320 and an output block 325. As in the analog variant 110 shown in FIG. 2, the digital variant 310 has $V_{dd}$ and $V_{ss}$ voltage inputs, as well as an optional scan line or row select input $V_{select}$ 205. In one embodiment, the output (e.g., $LED_1$ through $LED_n$) of the digital smart-pixel μC 310 is coupled with one or more LED devices in an LED lighting device, or in an LED backlight. In one embodiment, three or more LED devices can be controlled in a red-green-blue (RGB) sub-pixel arrangement, or some other sub-pixel matrix, for use in a smart-pixel micro-matrix display device. Input is by way of a digital input 305, which can be a connection to a digital data bus, a digital data link, or a differential signaling interface.

In one embodiment, the data storage module 320 buffers input received by the input block 315 for subsequent use by the output block 325. The data storage module 320 can contain memory, such as DRAM, SRAM, or flash memory, to buffer input data between refresh cycles. In one embodiment, all input data for a display frame is sent as a burst message individually to each smart-pixel μC 310, which store the pixel or sub-pixel information for the attached LEDs. The output module 325 can read the stored data and drive the attached LEDs at a standard update rate, or a content dependent update rate.

Figure 4:
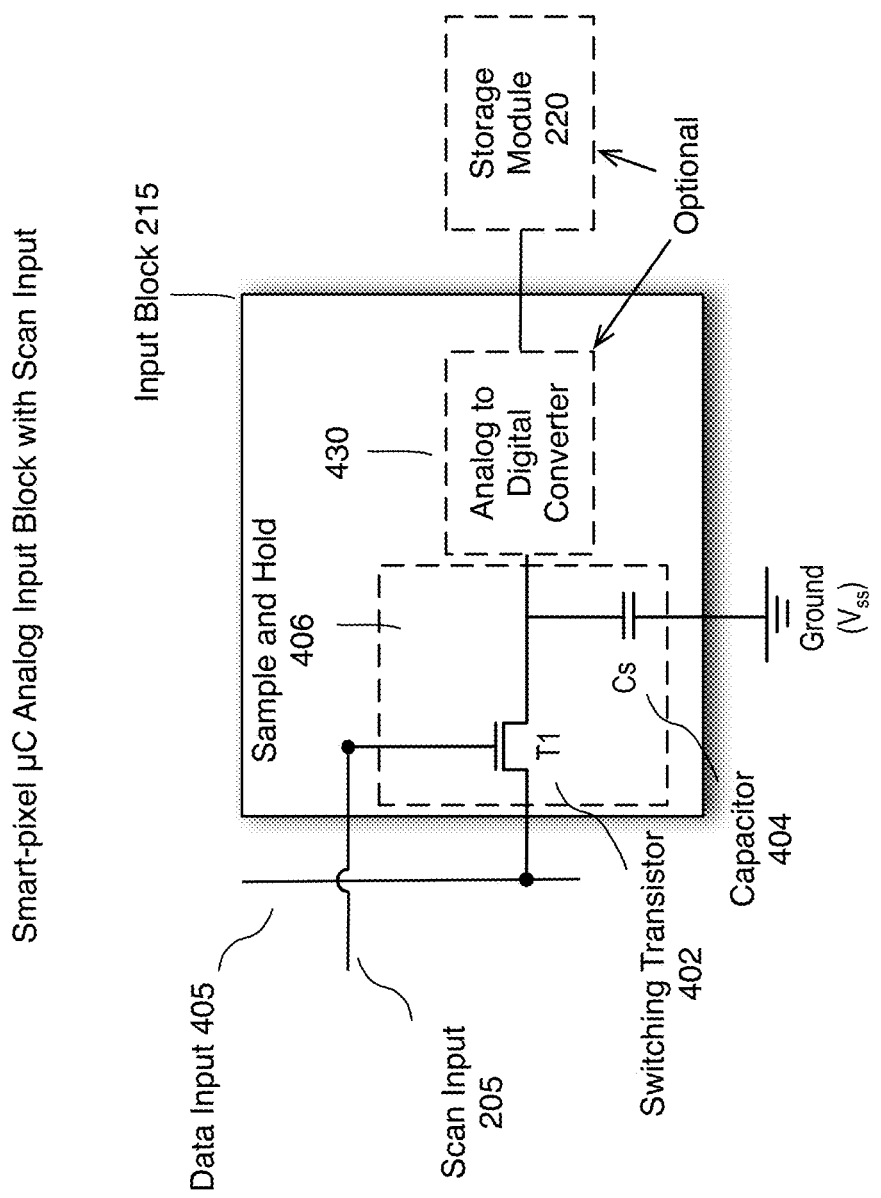
FIG. 4 is a block diagram of a smart-pixel microcontroller input block, according to an embodiment.

FIG. 4 is a block diagram of a smart-pixel μC input block, according to one embodiment. In one embodiment, the input block 215 couples to a data input 405 and a row select, or scan input 205. The input block 215 can utilize one or more variants of a sample and hold circuit 406. The exemplary sample and hold circuit 406 has one transistor T1 402 and one capacitor Cs 404, although more complex sample and hold circuits may also be used. The switching transistor 402 can be any type of insulated-gate field-effect transistor, such an n-type or a p-type semiconductor transistor. In this configuration, the switching transistor T1 402 has a gate electrode coupled with the scan input 205, and a first source/drain electrode coupled with the data input 305, and second source/drain electrode coupled with the capacitor Cs. In one embodiment, a voltage level scan signal enables the storage capacitor Cs 404 to charge, which ultimately enables current flow to the LED devices coupled with the output module. In one embodiment, the input module is coupled with an output module containing a driving transistor. In such embodiment, the μC creates a circuit similar to the 2T1C circuit of an active matrix display, although additional circuit configurations are possible. In one embodiment, the input module charges one or more capacitors in the storage module 220. The storage module 220 can also contain digital storage, in place of, or in addition to the one or more capacitors, and an analog-to-digital converter (ADC) 430 is used to store a digital representation of the analog input.

Figure 5A:
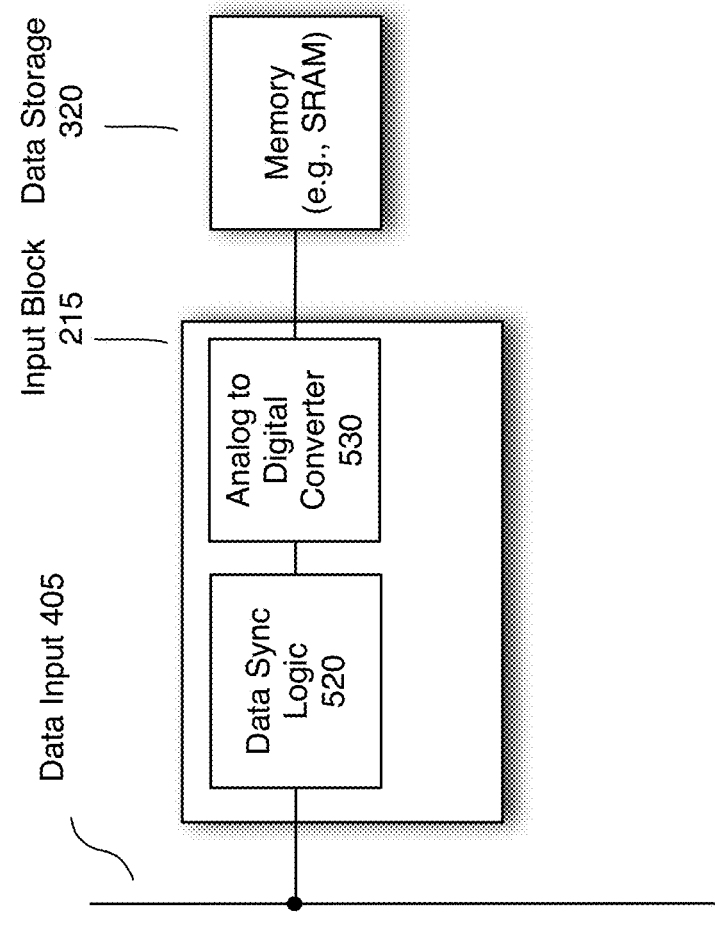
FIG. 5A, 5B are a block diagrams of alternate of another smart-pixel input blocks, according to an embodiment.

FIG. 5A is a block diagram of a smart-pixel μC input block with an analog data input coupled to digital storage. In one embodiment, the input block 215 couples with a data input via a data input pin, and outputs to a data storage module 320. In one embodiment, data synchronization logic 520 detects an analog update signal on the data line, and passes the incoming data into an ADC 530, to store a digital representation of the input data in the data storage module 320. In one embodiment, the update signal is an indicator to the data sampling logic to update the pixel state value with a new value.

Figure 5B:
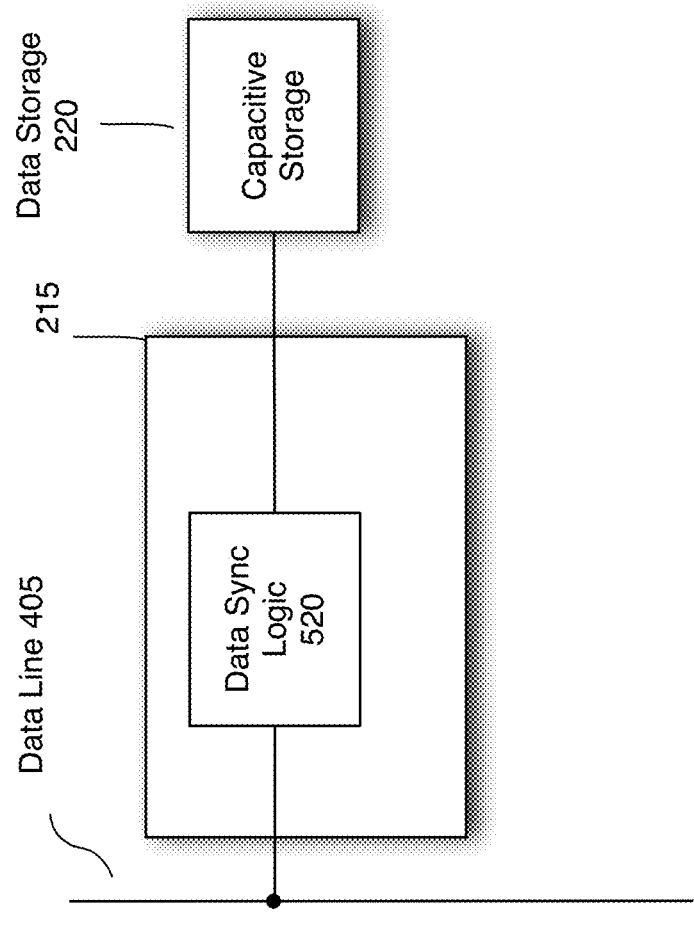

FIG. 5B is a block diagram of a smart-pixel μC input block with an analog data input coupled to capacitive storage. In one embodiment, the input block 215 couples with a data input via a data input pin, and outputs an analog signal to a data storage module 220 using capacitive storage. Data synchronization logic 520 detects an analog update signal on the data line 505, and passes the updated data into capacitive storage 220.

Figure 6:
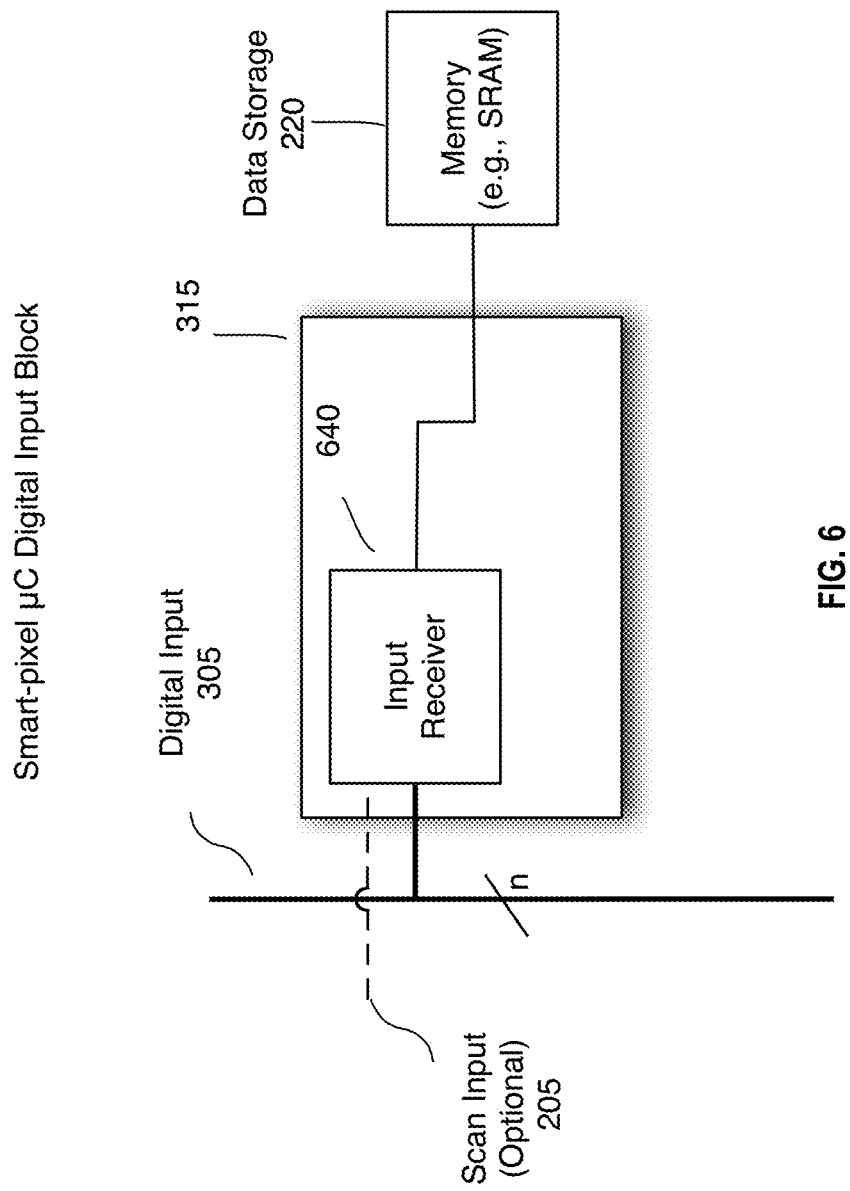
FIG. 6 is a block diagram of yet another smart-pixel input block, according to an embodiment.

FIG. 6 is a block diagram of an exemplary smart-pixel input block, according to one embodiment. The digital input block 315 is coupled with one or more digital input pins 305, and is coupled with a data storage module 220, which can contain capacitive storage, and/or one or more cells of digital memory, such as SRAM or DRAM, or nonvolatile memory, such as flash memory. An input receiver 540 couples with the digital input 305, and receives data from the one or more input pins and stores the received data in the data storage module 220. In one embodiment, a scan line 205 is coupled with the input block, to enable a scan line to signal a data update. In one embodiment, the data update events are carried via the digital input.

Figure 7:
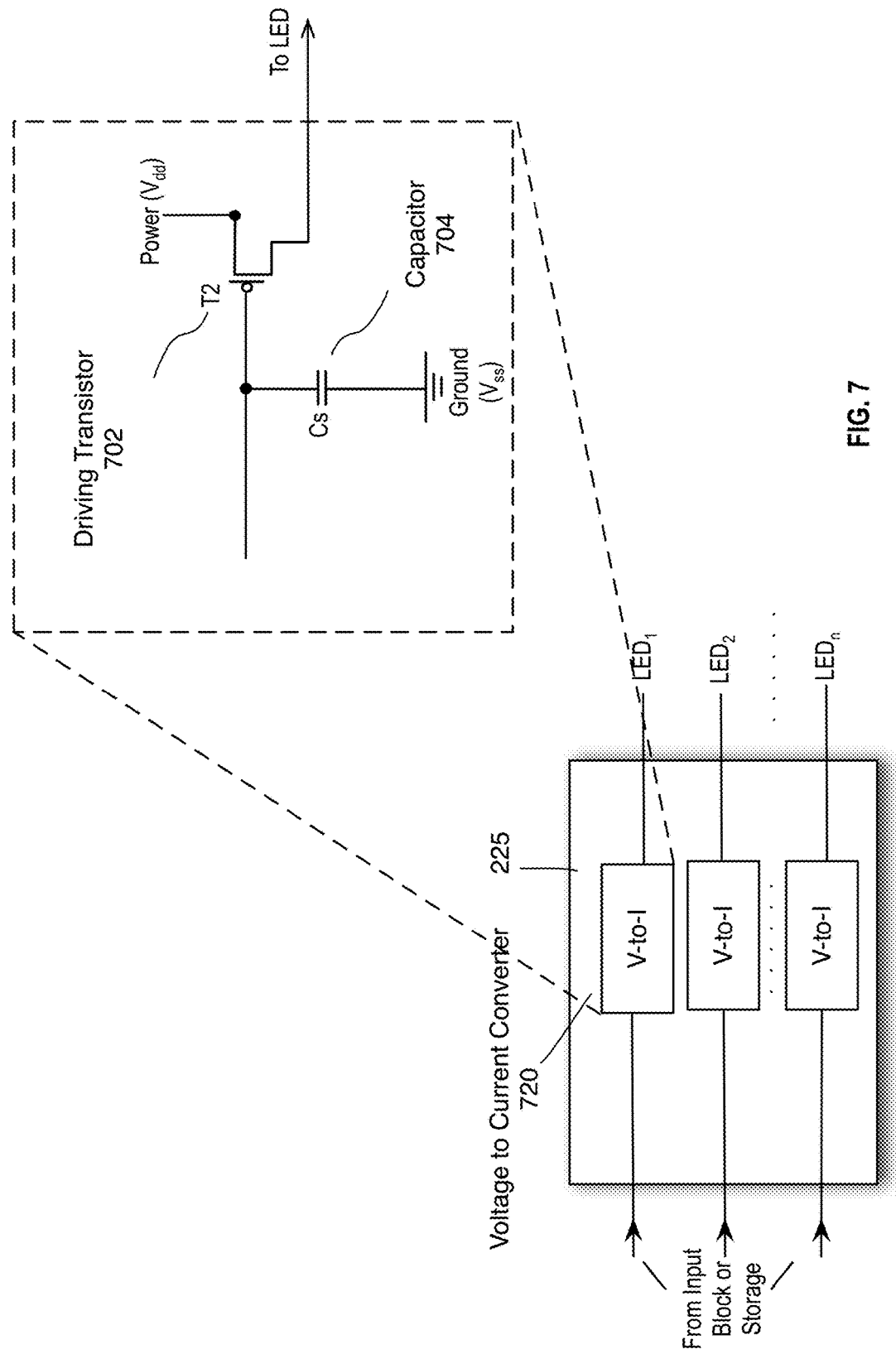
FIG. 7 is a block diagram illustrating a smart-pixel output block, according to an embodiment.
Figure 8:
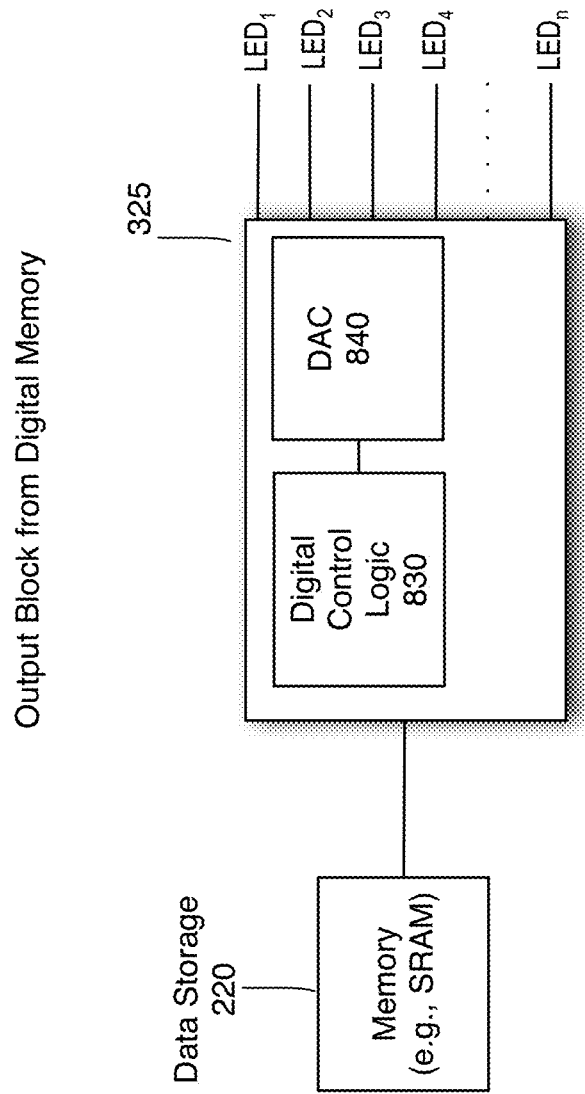
FIG. 8 is a block diagram illustrating another smart-pixel output block, according to an embodiment.

FIG. 7 is a block diagram illustrating a smart-pixel output block, according to one embodiment. In one embodiment, the smart-pixel μC device 110 has an output block 225 configured to couple with an analog input block, or capacitive storage. The output block 225 can use one or more variants of a voltage to current conversion circuit 720 for each LED output. The exemplary voltage to current conversion has a driving transistor T2 702, which has a first source/drain electrode coupled with a power source $V_{dd}$, and a second source/drain electrode coupled with one or more LED devices. A storage capacitor Cs 704 coupled with the gate electrode of the driving transistor T2 702 can be included in a variant of the output block, or can be included in the input block (e.g., Cs 404 of FIG. 4), as part of connecting circuitry between the input block 215 and the output block 225, or is one of the one or more capacitors in the storage module 220. A first electrode of the storage capacitor Cs 704 is coupled to a ground line $V_{ss}$, or may have its own ground. A second electrode is coupled with the gate electrode of the driving transistor T2 702. The voltage potential that is stored within the storage capacitor Cs opens the gate of the driving transistor T2 702, to drive current to the one or more attached LED devices. Each LED device (e.g., $LED_1$, $LED_2$, through $LE_n$) can represent a single LED device, or one or more LED devices in parallel, series, or a combination. It is to be noted that the particular drive methods employed by the voltage to current converter 225 is for illustration purposes, and alternate LED driving circuits are within the scope of the various embodiments, and can vary based on whether the implementation is display, lighting, or backlight oriented. FIG. 8 is a block diagram illustrating another smart-pixel output block, according to one embodiment. In one embodiment, a smart-pixel output block 325 can read from digital memory in the data storage module 220, and has digital control logic 830 coupled with a digital-to-analog converter (DAC) 840. A serial data link from the digital control logic to the DAC can be used to control one or more attached LEDs. It is to be noted that the particular drive methods employed by the output block 325 is for illustration purposes, and alternate LED driving circuits are within the scope of the various embodiments, and can vary based on whether the implementation is display, lighting, or backlight oriented. Additionally, each LED device (e.g., $LED_1$, $LED_2$, through $LED_n$) can represent a single LED device, or one or more LED devices in parallel, series, or a combination.

Figure 9:
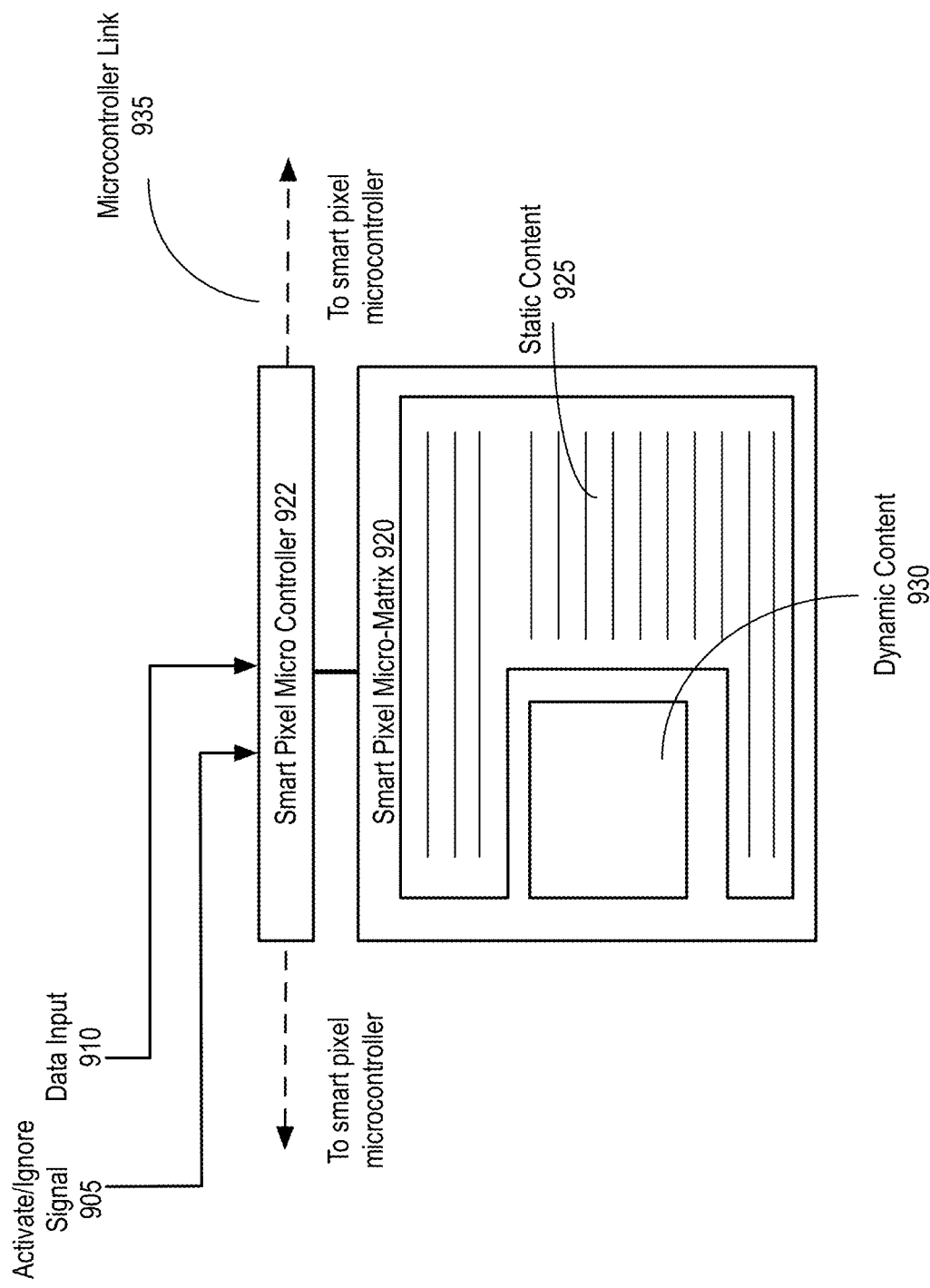
FIG. 9 illustrates an exemplary smart-pixel display system according to an embodiment.

FIG. 9 illustrates an exemplary smart-pixel display system according to one embodiment. In this example, a display panel 920 has a mixed display mode, in which a dynamic content 930, such as a video stream, is shown in a window, while the rest of the display shows static content 925, such as a page of text. Data input can couple with input pins of the smart-pixel micro controller (μC) device 922. In one embodiment, an activate/ignore signal 905 couples to a scan input, and is used to transmit address information, transmit frame update information, or frame metadata to the smart-pixel microcontroller. In one embodiment, both data and address information is transmitted over the data input 910. The smart-pixel micro-matrix 920 can correspond to a single display, or a portion of a display, such as a high definition television, or large outdoor display. In one embodiment, the μC device 922 can couple to other microcontrollers via a microcontroller link 935. In one embodiment, the smart-pixel micro-matrix 920 can be one component of a segmented or modular display created by coupling the μC device 922 to an additional μC device with an attached smart-pixel micro-matrix. Coupling multiple smart-pixel micro matrix assemblies and linking each μC device 922 can create increasingly larger displays using a modular configuration. In one embodiment, the microcontroller link 935 can be a wireless link. In one embodiment, one or more μC devices can be used as repeater devices in a microcontroller link 935 network.

Figure 10:
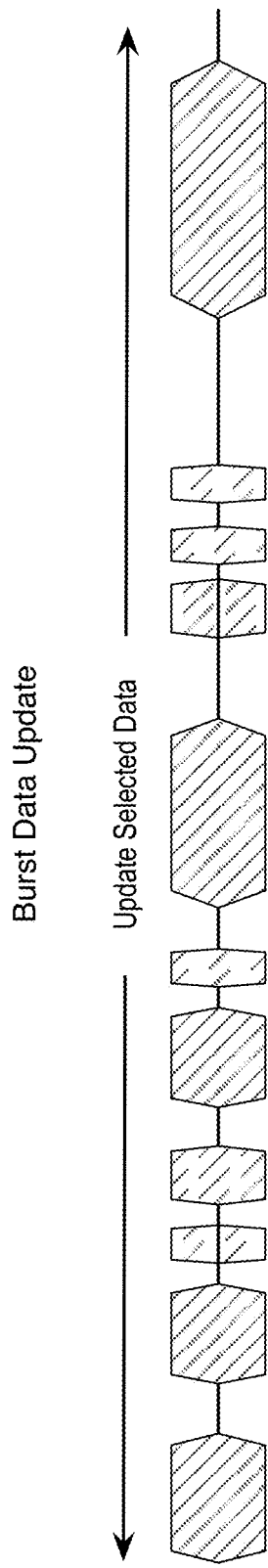
FIG. 10 is a timing diagram illustrating exemplary pixel update timing according to an embodiment.

FIG. 10 is a timing diagram illustrating exemplary pixel update timing according to one embodiment. In the example of FIG. 10, new data is transmitted whenever new content for a sub pixel controlled by one embodiment of the smart-pixel μC device, such as the smart-pixel μC device 922 of FIG. 9. New data can be transmitted to the μC device 922 and stored in a storage module. Each time new data is available for a sub-pixel controlled by the μC device 922, data is transmitted, without following a fixed schedule. A periodic refresh operation is not required, as shown in FIG. 10 by the horizontal lines, which indicate idle periods. In one embodiment, frame data is transmitted faster than the scheduled display update rate, and the pixel data is stored in one embodiment of the μC device storage module (e.g., storage module 220, storage module 320). The pixel data is then read from the storage module at a scheduled update interval. This enables multiple frames of data to be sent in a burst mode, received by an input block of the μC device 922, and read from the storage module at the appropriate interval by the output block.

Figure 11:
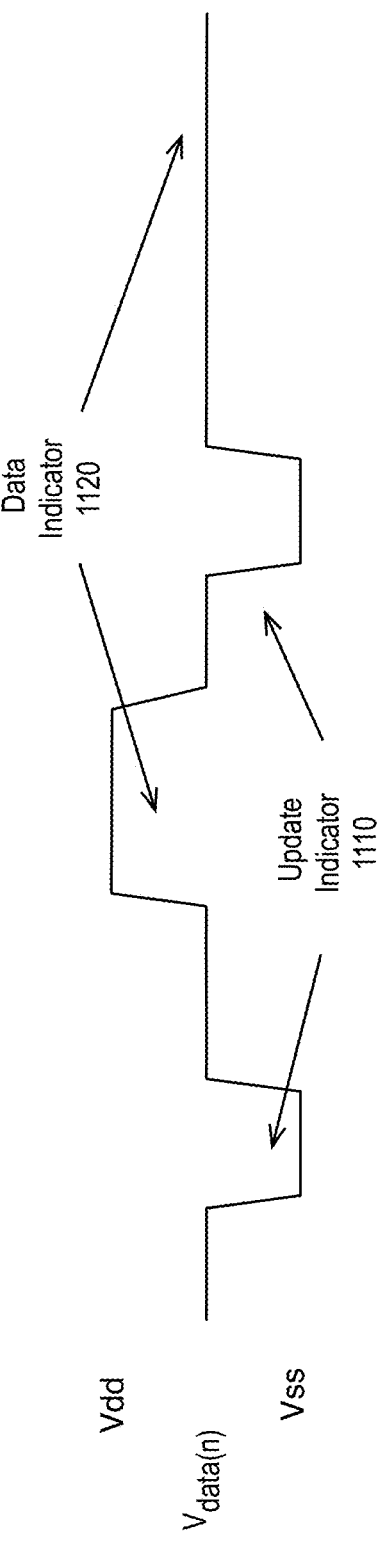
FIG. 11 is a timing diagram of a smart-pixel frame update signal, according to an embodiment.

FIG. 11 is a timing diagram of a smart-pixel frame update signal, according to one embodiment. In one embodiment, an analog data input $V_{data(n)}$ senses voltages between a $V_{dd}$ and a $V_{ss}$ value. For example, $V_{dd}$ can be +5V and $V_{ss}$ can be −5V. Alternatively, $V_{dd}$ is some positive or negative voltage and $V_{ss}$ is tied to ground. In micro scale implementations, the voltages can be much smaller; in lighting or outdoor display implementations, the voltages can be higher. The analog voltage signal is sensed by data sync logic 420 coupled with an analog to digital converter (ADC). A digital sub-pixel data value is derived from the analog input voltage value. For example a drop to $V_{ss}$ can act as a sync indicator 1110 to data sync logic (e.g., data sync logic 520). The data sync logic 520 can then pass incoming data indicator 1120 to ADC circuitry 430, to store the analog input as a digital value in the data storage module 220. In one embodiment, the incoming data value is stored in data storage 220 in a capacitive storage module.

Figure 12:
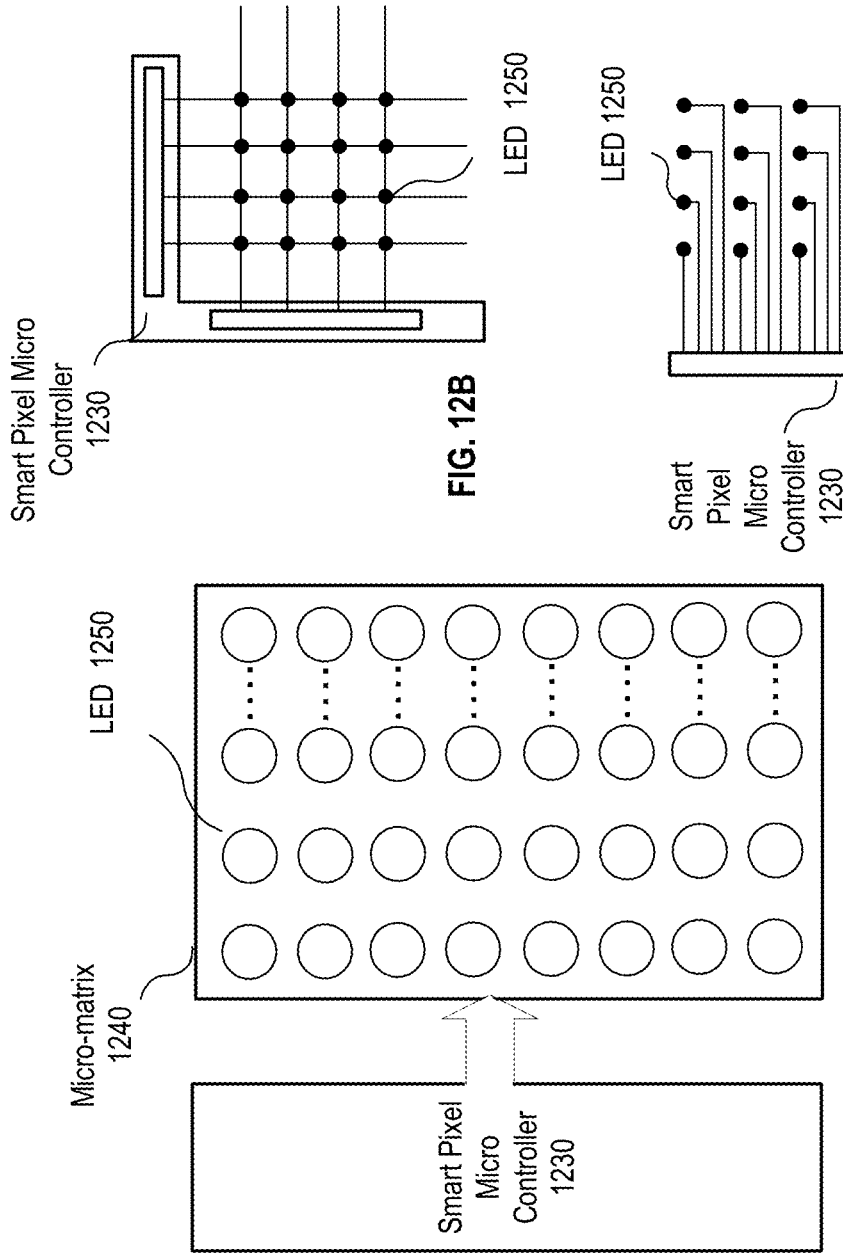
FIG. 12A, FIG. 12B, and FIG. 12C are block diagrams illustrating various exemplary micro-matrix configurations, according to an embodiment.

FIG. 12A, FIG. 12B, and FIG. 12C are block diagrams illustrating various exemplary micro-matrix configurations. FIG. 12A illustrates a smart pixel micro-matrix, which includes one or more smart-pixel μC devices 1230, and a matrix of LED devices 1250, which can be conventional LED devices, organic LED devices, or μLED devices. Each μC device 1230 can control a single LED, or a single μC device 1230 can control the micro-matrix 1240. In one embodiment, the micro-matrix is addressed in row/column form. In one embodiment, each LED device 1250 is addressed individually. In one embodiment, μLEDs are used to create a high-density high definition display. In one embodiment, LED devices, as are known in the art, are used for large outdoor displays, and one or more μC devices 1230 can be networked to control the display, with various μC devices 1230 acting as tile controllers for each segment of the display. In one embodiment, each segment can communicate over a microcontroller link 935, as illustrated in FIG. 9. In one embodiment, the micro-matrix 1240 is an LED light source, to produce white or colored light, either by LED emission, or via emission plus phosphorescence. In one embodiment, the micro-matrix 1240 is an LED backlight for an LCD display.

FIG. 12B illustrates an embodiment in which a μC device controls a mesh of LED devices 1250 in a "passive" micro-matrix configuration, in which the LEDs are arranged in rows and columns. The LEDs can be coupled in series, in parallel, or in a combination, to each LED output pin of the μC device 1230. One or more μC devices 1230 can be used as a microcontroller for the LED devices.

FIG. 12C illustrates yet another LED to μC device arrangement according to one embodiment. Each LED device 1250 can be tied to a single output pin of the smart-pixel μC device 1230. The LED devices 1250 can each be blue or UV LED devices used with a remote phosphor, to create white light. In one embodiment, the LEDs are blue LED devices using directly applied phosphor, such as a YAG:Ce3 phosphor. The LED devices 1250 can also be part of a display device. The four LEDs illustrated can be configured as RGBY sub-pixels, or additional LED devices can be used, such as five LED devices to create a RGBYC arrangement.

Figure 13:
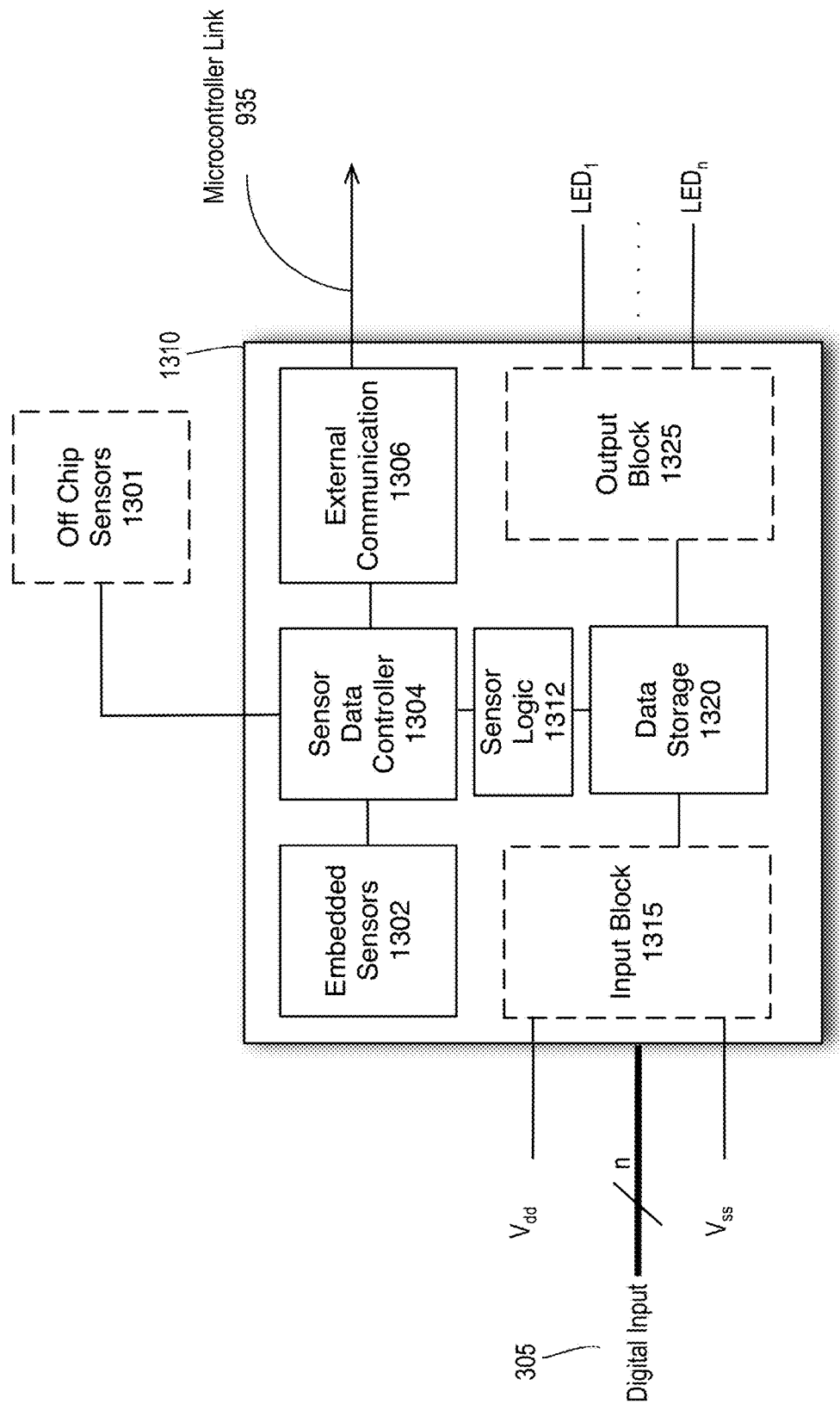
FIG. 13 is a block diagram of an alternate smart-pixel microcontroller structure with sensor input, according to an embodiment.

FIG. 13 is a block diagram of an alternate smart-pixel μC, according to one embodiment. In one embodiment, a smart-pixel μC 1310 contains, one or more embedded sensor devices 1302, such as an optical, electrical, thermal, or pressure sensor. The embedded sensors 1302 can couple with a sensor data controller 1304. In one embodiment, the sensor data controller 1304 couples with one or more off chip sensors 1301, to receive additional sensor data from off chip sensors 1301. In one embodiment, sensor logic 1312, to process sensor data from embedded or external sensors is coupled with the sensor data controller 1304 and the data storage 1320. Sensor data processed by the sensor logic 1312 can be stored in the data storage module 1320. In one embodiment, an external communication module 1306 enables a microcontroller link 935 with other μC devices, as illustrated in FIG. 9.

Some smart-pixel μC variants configured for sensor input can also control LED devices. In one embodiment, the smart-pixel μC 1310 has an input block 1315, data storage module 1320 and an output block 1325. In one embodiment, the smart-pixel μC 1310 has a digital input 305, similar to the digital input of smart-pixel μC 310 as shown in FIG. 3, as well as $V_{dd}$ and $V_{ss}$ voltage inputs. In one embodiment, the output (e.g., $LED_1$ through $LED_n$) of the digital smart-pixel C 1310 is coupled with one or more LED devices in an LED lighting device, or in an LED backlight. Each LED device output can couple with one or more LED devices in series, parallel, or a combination of series and parallel.

Figure 14:
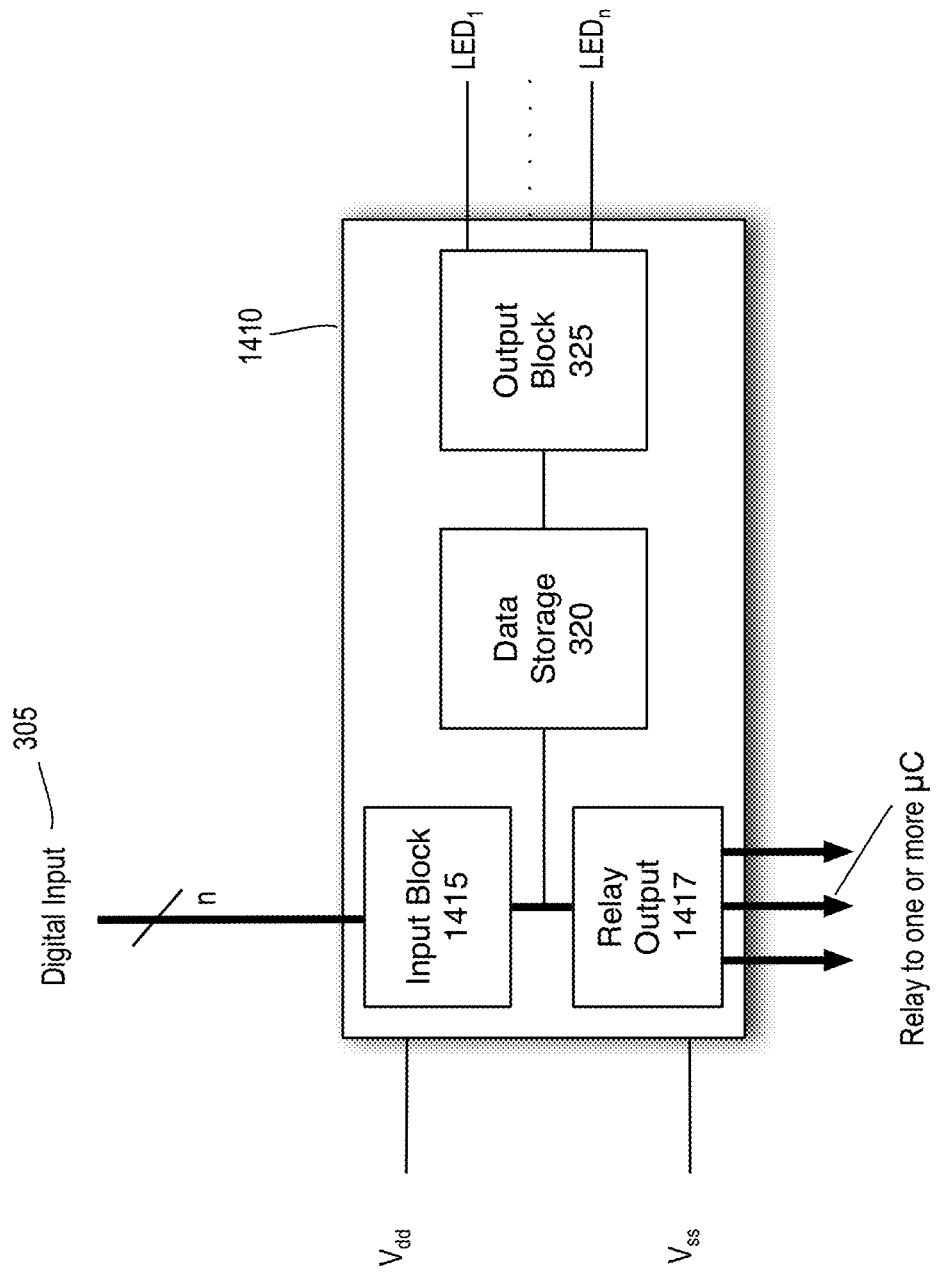
FIG. 14 is a block diagram of an alternate smart-pixel microcontroller structure with a data relay, according to an embodiment.

FIG. 14 is a block diagram of an alternate smart-pixel μC, according to one embodiment. In one embodiment, a smart-pixel C 1410 configured for digital input has a data storage module 320 and an output block 325 similar to the smart pixel μC 310 of FIG. 3, in addition to $V_{dd}$ and $V_{ss}$ voltage inputs. In one embodiment, the smart-pixel μC 1410 additionally has an input block 1415 coupled with a relay output 1417, to relays or re-transmit incoming digital input 305 to one or more additional a smart-pixel μC. In one embodiment, the smart-pixel μC 1410 drives output to one or more LED devices (e.g., $LED_1$ through $LED_n$). Each LED device output can couple with one or more LED devices in series, parallel, or a combination of series and parallel.

Figure 15:
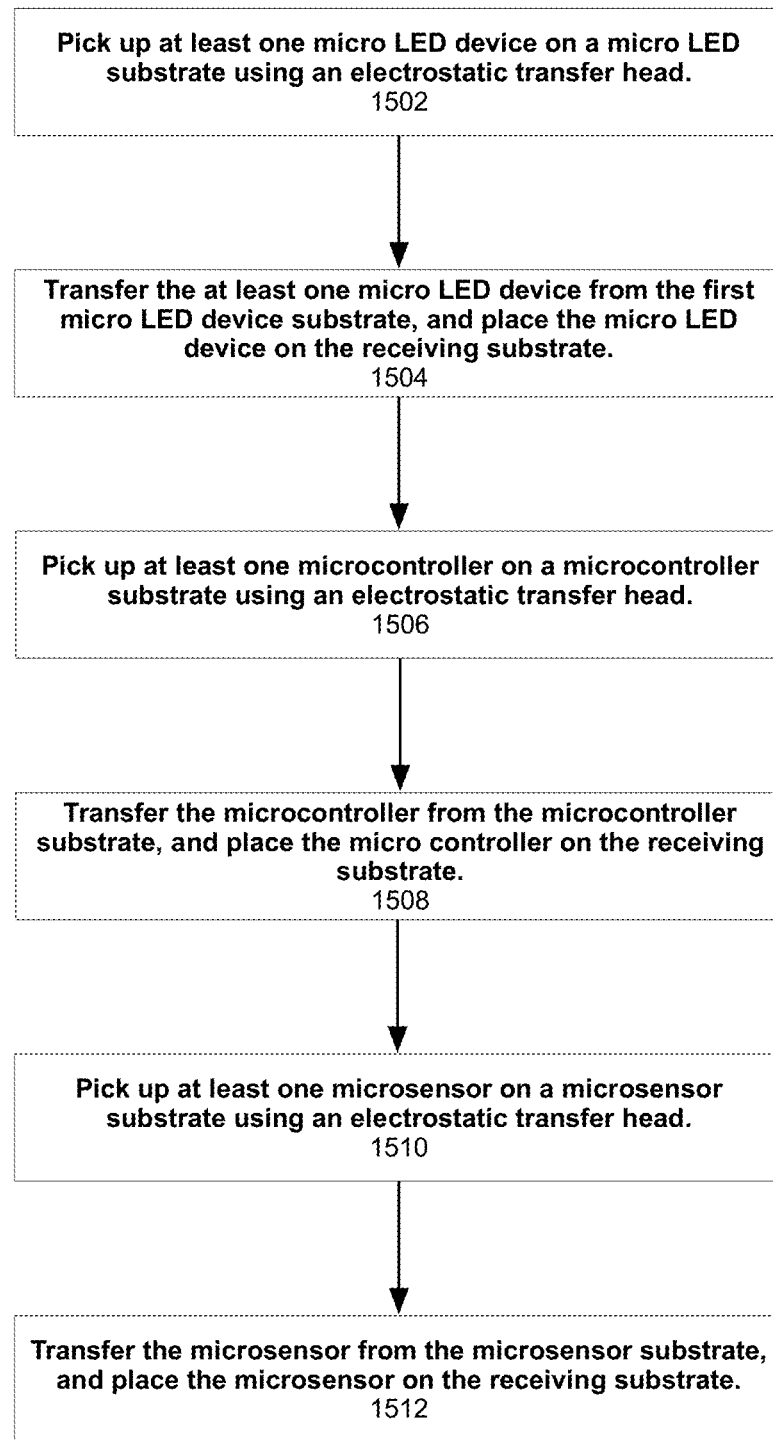
FIG. 15 is a flow diagram of one method of creating a smart-pixel micro-matrix display or lighting substrate, according to an embodiment.

FIG. 15 is a flow diagram of one method of creating a smart-pixel display, according to one embodiment. An exemplary method of manufacturing micro scale devices, such as micro scale LED devices (μLEDs) and microchips, such as a micro integrated circuit controller (μC) are described in U.S. patent application Ser. No. 13/711,554, as previously incorporated. The μLED devices and μCs are prepared on separate carrier substrates, and are poised for pickup and transfer using an array of electrostatic transfer heads. For example, an array of red-emitting μLED devices, blue-emitting μLED devices, and green-emitting μLED devices are prepared separate carrier substrates. Likewise and array of μCs are prepared on a separate carrier substrate. As shown at block 1502, an array of electrostatic transfer heads is positioned over a carrier substrate carrying a plurality of μLED devices, and picks up the plurality of μLED devices from the carrier substrate. As shown at block 1504, the array of μLED devices is placed in the appropriate position on the receiving substrate. The same or different array of electrostatic transfer heads is then used to pick up, transfer, and position each of the separate arrays of μLED devices for each color used in the smart-pixel array onto the receiving substrate. The receiving substrate may be, but is not limited to, a display substrate or a lighting substrate. As shown at block 1506, the same or a different electrostatic transfer head array is positioned over the carrier substrate carrying an array of LED μController devices, and picks up the array of μController devices from the μC carrier substrate. As shown at block 1508, each μC device is transferred onto the same receiving substrate as the arrays of μLED devices and placed in the appropriate position on the receiving substrate. In one embodiment, one or more sensor devices are also placed on the receiving substrate. As shown at block 1510, the same or a different electrostatic transfer head array as used for the μLED devices and μCs is positioned over the carrier substrate carrying an array of μSensor devices, and picks up one or more of μSensor devices from the μSensor carrier substrate. As shown at block 1512, each μSensor device is transferred onto the same receiving substrate as the arrays of μLED devices and placed in the appropriate position on the receiving substrate.

Figure 16:
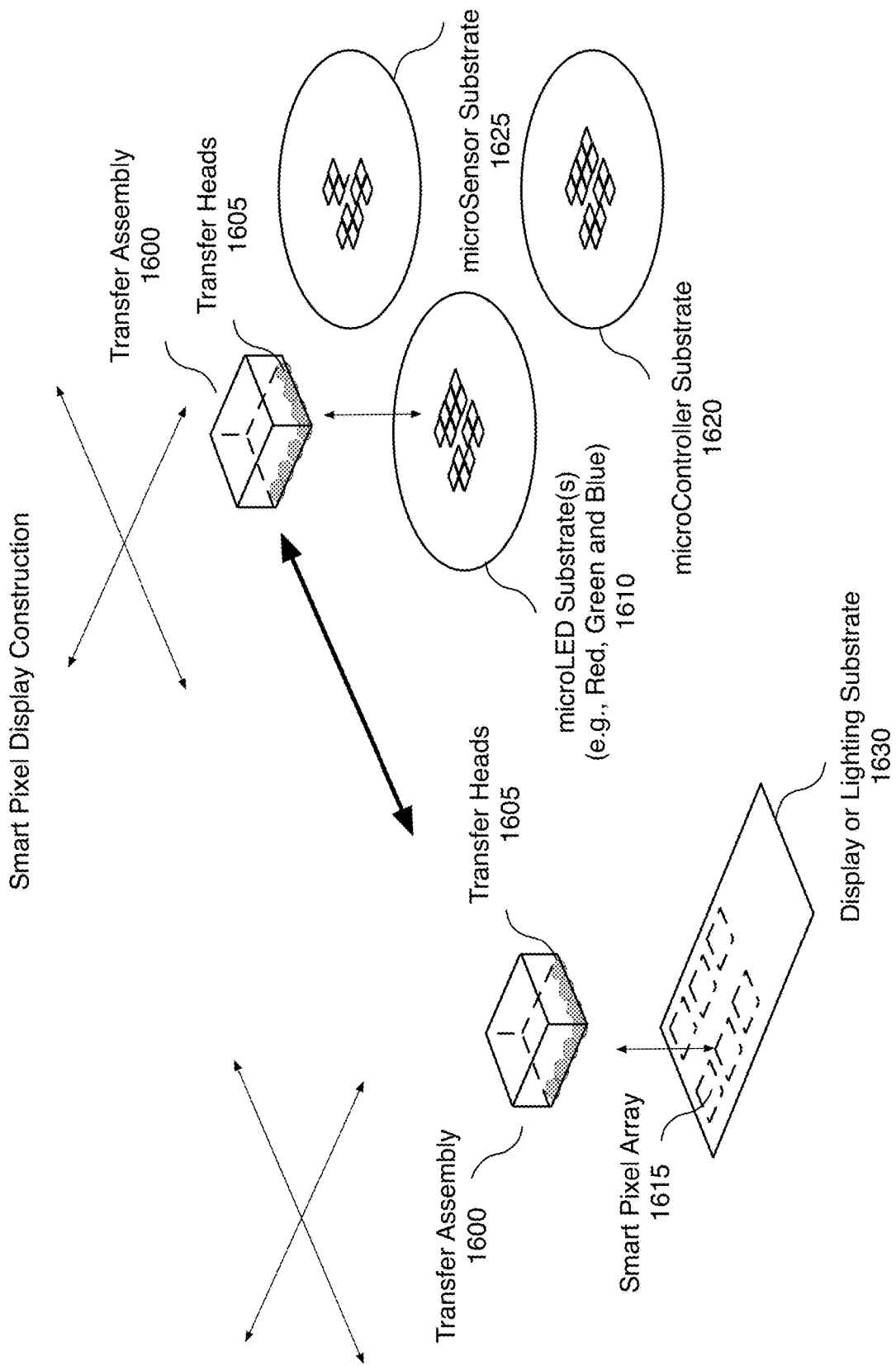
FIG. 16 is an illustration processing micro-device substrates of micro devices into a receiving substrate, according to an embodiment.

FIG. 16 is an illustration processing micro-device substrates of micro devices into a receiving substrate, according to one embodiment. Separate carrier substrates are used for each μLED color 1610, for the μCs 1620, and for the μSensors 1625. One or more transfer assemblies 1600 can be used to pick up and transfer microstructures from the carrier substrates (e.g., 1610, 1620, 1625) to the receiving substrate, such as display or lighting substrate 1630, to form a smart-pixel array 1615. In one embodiment, separate transfer assemblies 1600 are used to transfer any combination of μLED colors 1610, for the μCs 1620, and for the μSensors 1625. The display substrate is prepared with distribution lines to connect the various the μLED and μC structures. Multiple distribution lines can be coupled to landing pads and an interconnect structure, to electrically couple the μLED devices and the μC devices, and to couple the various μC devices to each other. The receiving substrate can be a display substrate 1630 of any size ranging from micro displays to large area displays, or can be a lighting substrate, for LED lighting, or for use as an LED backlight for an LCD display. The μLED and μC structures are bonded to the same side of the substrate surface.

Bonds can be made using various connections such as, but not limited to, pins, conductive pads, conductive bumps, and conductive balls. Metals, metal alloys, solders, conductive polymers, or conductive oxides can be used as the conductive materials forming the pins, pads, bumps, or balls. In an embodiment, heat and/or pressure can be transferred from the array of transfer heads to facilitate bonding. In an embodiment, conductive contacts on the μC, LED devices, or optional sensor devices are thermocompression bonded to conductive pads on the substrate. In this manner, the bonds may function as electrical connections to the μC, LED devices, or sensor devices. In an embodiment, bonding includes indium alloy bonding or gold alloy bonding the conductive contacts with the conductive pads. Other exemplary bonding methods that may be utilized with embodiments of the invention include, but are not limited to, thermal bonding and thermosonic bonding. In an embodiment, the μC, LED devices, or sensor devices are bonded to landing pads in electrical connection with the distribution lines on the substrate to electrically couple one or more LED devices to the smart-pixel μC. The receiving substrate can vary based on the application of the smart-pixel micro-matrix. In one embodiment, a display substrate is used, to form a smart-pixel micro-matrix LED display device, in which the smart-pixels are used as picture elements in a high-resolution display.

Figure 17:
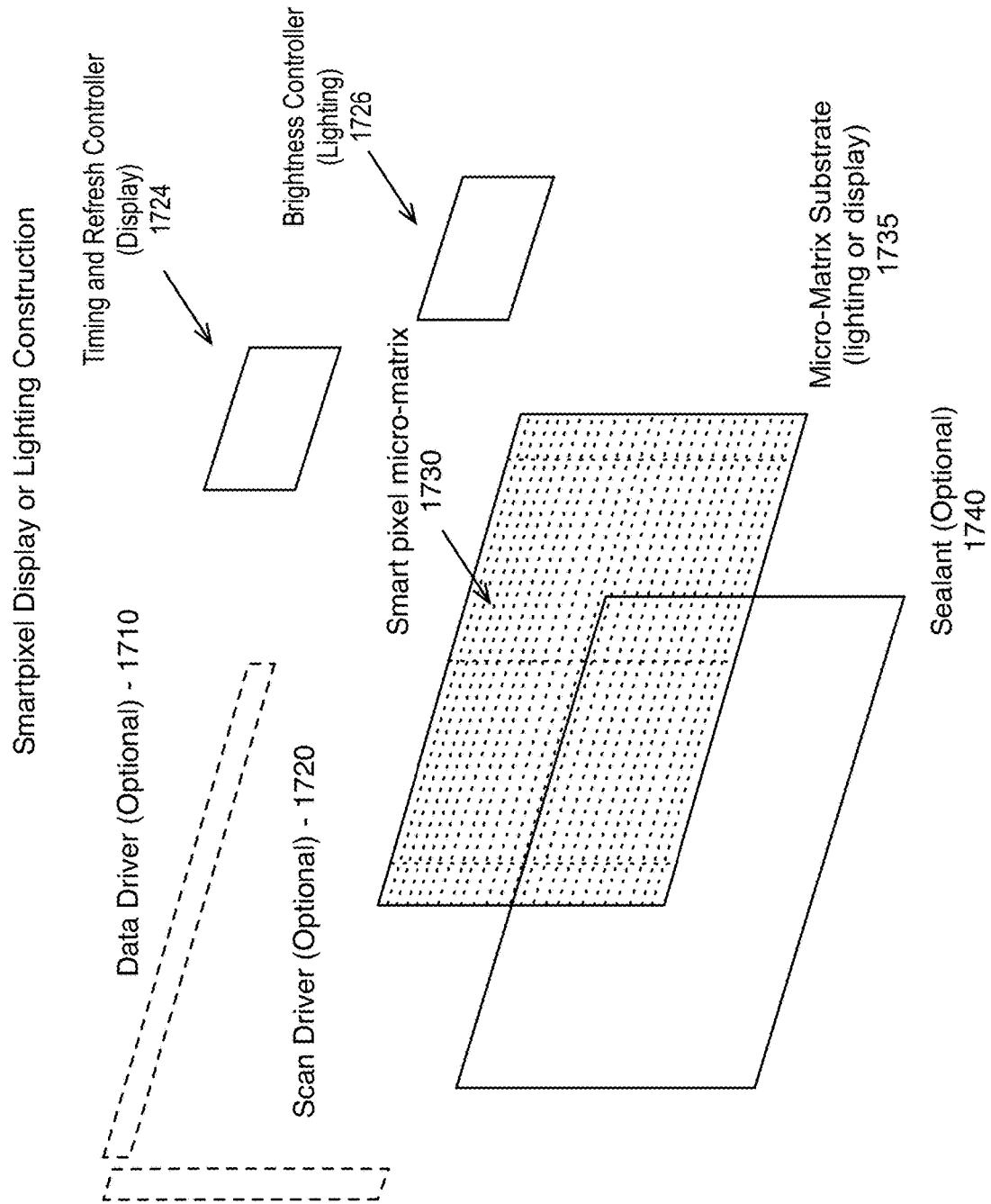
FIG. 17 is an illustration of a smart-pixel display assembly created from an array of smart-pixels assembled on a display or lighting substrate, according to an embodiment.

FIG. 17 is an illustration of a smart-pixel assembly created from an array of smart-pixels assembled on a lighting or display substrate. In one embodiment, the smart-pixel receiving substrate is a smart-pixel micro-matrix 1730 that is prepared with distribution lines, to couple the micro-matrix of μC devices and LEDs to one or more controllers. The LED smart-pixel micro-matrix can be placed on the prepared substrate 1730 in the manner described in FIG. 16. In one embodiment, the receiving substrate 1735 is a display substrate, and multiple smart-pixel micro-matrix assemblies can couple with each other to form a high-resolution display system. In one embodiment, the receiving substrate 1735 is a lighting substrate, and one or more smart pixel micro matrix assemblies can be used with a yellow phosphor to form a white light source. In one embodiment, one or more sensors, which can be sensors as known in the art, or can be micro-scale sensors with a maximum (x, y) dimension of 1 to 100 μm, can be used to detect a drift in the white point of the display over time, and the display can be re-calibrated from time to time to maintain a consistent white point.

An optional sealant 1740 can be used to secure and protect the substrate. In one embodiment, the sealant is transparent, to allow a display or lighting substrate with top emission LED devices to display through the sealant. In one embodiment, the sealant is opaque, for use with bottom emission LED devices. In one embodiment, a data driver 1710 and a scan driver 1720 couple with multiple data and scan lines on the display substrate. In one embodiment, each of the smart-pixel devices couple with a refresh and timing controller 1724. The refresh and timing controller 1724 can address each LED device individually, to enable asynchronous or adaptively synchronous display updates. In one embodiment, a brightness controller 1726 can couple with the micro-matrix substrate 1735 used to control the brightness of an LED micro-matrix LED lighting device, which can also be used as a backlight in an LCD. The brightness controller 1726 can also couple with one or more optical sensors to allow adaptive adjustment of the light output. In one embodiment, one or more thermal sensors enable a smart-pixel based LED light source to automatically manage thermal output.

Table 1 provides a list of exemplary implementations in accordance with the various embodiments that use red-green-blue (RGB) displays with 1920×1080p and 2560×1600 resolutions. It is to be appreciated that embodiments of the invention are not limited to RGB color schemes or the 1920×1080p or 2560×1600 resolutions, and that the specific resolution and RGB color scheme is for illustrational purposes only.

TABLE 1

| Display Substrate | Pixel Pitch (x, y) | Sub-Pixel pitch (x, y) | Pixels per inch (PPI) |
|---|---|---|---|
| 55" 1920 × 1080 | (634 μm, 634 μm) | (211 μm, 634 μm) | 40 |
| 10" 2560 × 1600 | (85 μm, 85 μm) | (28 μm, 85 μm) | 299 |
| 4" 640 × 1136 | (78 μm, 78 μm) | (26 μm, 78 μm) | 326 |
| 5" 1920 × 1080 | (58 μm, 58 μm) | (19 μm, 58 μm) | 440 |

In the above exemplary embodiments, the 40 PPI pixel density may correspond to a 55 inch 1920×1080p resolution television, and the 326 and 440 PPI pixel density may correspond to a handheld device with retina display. In accordance with embodiments of the invention, the maximum (x,y) dimension of the μLED devices and the μC for a smart-pixel 120 fit within the allotted pixel pitch, such as the exemplary allotted pixel pitches described above with regard to Table 1. For example, in one embodiment a 5" RGB display with 440 PPI may include a red-emitting μLED device, green-emitting μLED device, and blue-emitting μLED device, each with maximum (x, y) dimension that fits within the corresponding (19 μm, 58 μm) sub-pixel pitch, and a μC device that fits within the (58 μm, 58 μm) pixel pitch. For example, in one embodiment a 55" RGB display with 40 PPI may include a red-emitting μLED device, green-emitting μLED device, and blue-emitting μLED device, each with maximum (x, y) dimension that fits within the corresponding (211 μm, 634 μm) sub-pixel pitch, and a μC device that fits within the (634 μm, 634 μm) pixel pitch.

In utilizing the various aspects of this invention, it would become apparent to one skilled in the art that combinations or variations of the above smart-pixel embodiments are possible. Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A light emitting assembly comprising:
    an array of light emitting diode (LED) device and an array of microcontroller chips arranged in an array of micro-matrices, each micro matrix including a matrix of light emitting diode (LED) devices electrically connected with a microcontroller chip;
    wherein each microcontroller chip includes a first output pin that is electrically coupled with a first string of LED devices to drive the first string of LED devices, and a second output pin that is electrically coupled with a second string of LED devices to drive the second string of LED devices; and
    distribution lines to electrically connect the array of microcontroller chips and the array of LED devices, wherein the distribution lines electrically connect a plurality of microcontroller chips of the array of microcontroller chips to one another.

2. The assembly of claim 1, further comprising one or more column drivers electrically connected with the array of microcontroller chips.

3. The assembly of claim 2, further comprising one or more row drivers electrically connected with the array of microcontroller chips.

4. The assembly of claim 1, wherein each LED device in the array of LED devices has a maximum length or width dimension of 1 to 100 μm.

5. The assembly of claim 1, wherein each LED device in the array of LED devices has a maximum length or width dimension of 1 to 100 μm.

6. The assembly of claim 5, wherein the array of LED devices is bonded to landing pads in electrical connection with the distribution lines.

7. The assembly of claim 1, wherein each microcontroller chip in the array of microcontroller chips includes one or more input circuits and at least one output circuit.

8. The assembly of claim 1, further comprising a timing controller coupled with one or more column drivers, the timing controller operable to signal one or more row drivers to cause a first row of a display panel to be not refreshed in a current data frame and a second row of the display panel to be refreshed in the current data frame.

9. The assembly of claim 1, further comprising a plurality of sensors, wherein each sensor is selected from the group consisting of an optical sensor, and electrical sensor, a thermal sensor, and a pressure sensor.

10. The assembly of claim 9, wherein each sensor is not located within a microcontroller chip of the array of microcontroller chips.

11. The assembly of claim 1, wherein each microcontroller chip includes a data input terminal and a scan input terminal.

12. The assembly of claim 11, wherein each microcontroller chip includes a sample and hold circuit, an analog to digital converter, and a data storage module.

13. The assembly of claim 11, wherein each microcontroller chip includes a data synchronization logic, an analog to digital converter, and a data storage module.

14. The assembly of claim 1, wherein each microcontroller includes a digital input terminal.

15. The assembly of claim 1, wherein each microcontroller includes a plurality of digital input terminals.

16. The assembly of claim 15, wherein each microcontroller includes a Vdd input and a Vss input.

17. The assembly of claim 15, wherein each micro controller chip includes an input receiver, a data storage module, a digital control logic, and a digital to analog controller.

18. The assembly of claim 15, wherein each LED device in the array of LED devices has a maximum length or width dimension of 1 to 100 μm.

* * * * *